US011184986B2

(12) United States Patent
Heo et al.

(10) Patent No.: US 11,184,986 B2
(45) Date of Patent: Nov. 23, 2021

(54) DISPLAY DEVICE

(71) Applicant: LG ELECTRONICS INC., Seoul (KR)

(72) Inventors: Jinha Heo, Seoul (KR); Dohyeon Kim, Seoul (KR); Sangdon Park, Seoul (KR); Jinuk Baek, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 100 days.

(21) Appl. No.: 16/262,730

(22) Filed: Jan. 30, 2019

(65) Prior Publication Data

US 2019/0239364 A1 Aug. 1, 2019

(30) Foreign Application Priority Data

Jan. 31, 2018 (KR) .................... 10-2018-0012323

(51) Int. Cl.
*G09F 7/18* (2006.01)
*H05K 5/00* (2006.01)
(Continued)

(52) U.S. Cl.
CPC ............ *H05K 5/0017* (2013.01); *G09F 7/18* (2013.01); *G09F 9/3026* (2013.01); *H05K 5/0008* (2013.01); *H05K 5/0021* (2013.01); *H05K 5/0204* (2013.01); *H05K 5/0217* (2013.01); *H05K 5/03* (2013.01); *G09F 2007/1843* (2013.01); *G09F 2007/1852* (2013.01); *G09F 2007/1891* (2013.01)

(58) Field of Classification Search
CPC .. H05K 5/0017; H05K 5/0008; H05K 5/0217; H05K 5/0021; H05K 5/0204; H05K 5/03; G09F 9/3026; G09F 2007/1843; G09F 2007/1891; G09F 7/18; G09F 2007/1852; F21B 2001/0035
USPC .......................................... 40/605; 292/251.5
See application file for complete search history.

(56) References Cited

U.S. PATENT DOCUMENTS 5,076,623 A * 12/1991 Richards ............. E05B 47/0038
292/144
7,843,295 B2 * 11/2010 Fullerton .................. G09F 7/04
24/303
(Continued)

FOREIGN PATENT DOCUMENTS

KR         100873849 B1 *  12/2008
KR       1020100138197      12/2010
(Continued)

OTHER PUBLICATIONS

PCT International Application No. PCT/KR2018/016605, International Search Report dated Apr. 10, 2019, 3 pages.

*Primary Examiner* — Cassandra Davis
(74) *Attorney, Agent, or Firm* — Lee, Hong, Degerman, Kang & Waimey

(57) ABSTRACT

A multi-display device is disclosed. The multi-display device includes a display module; a frame positioned behind the display module, a displacement adjustment unit positioned between the display module and the frame, mounted on the display module or the frame, and configured to adjust a distance between the display module and the frame, and an attachment part fixed to the displacement adjustment unit and attached to or detached from the frame or the display module.

5 Claims, 34 Drawing Sheets

(51) Int. Cl.
*H05K 5/02* (2006.01)
*H05K 5/03* (2006.01)
*G09F 9/302* (2006.01)

(56) References Cited

U.S. PATENT DOCUMENTS

| | | | |
|---|---|---|---|
| 10,667,414 B2* | 5/2020 | Kim | H05K 5/0208 |
| 2003/0056413 A1* | 3/2003 | Wiemer | G09F 9/3026 |
| | | | 40/730 |
| 2015/0055279 A1* | 2/2015 | McBroom | B25B 23/12 |
| | | | 361/679.01 |
| 2016/0210886 A1* | 7/2016 | Brashnyk | F16M 11/121 |
| 2019/0277377 A1* | 9/2019 | Heo | H05K 5/0217 |
| 2019/0350094 A1* | 11/2019 | Miller | H05K 5/0021 |
| 2021/0033240 A1* | 2/2021 | Choi | G06F 1/1607 |

FOREIGN PATENT DOCUMENTS

| | | |
|---|---|---|
| KR | 1020160062777 | 6/2016 |
| KR | 1020160076765 | 7/2016 |
| KR | 101705512 | 2/2017 |
| KR | 1020170083468 | 7/2017 |

\* cited by examiner

DISPLAY DEVICE

Pursuant to 35 U.S.C. § 119(a), this application claims the benefit of earlier filing date and right of priority to Korean Patent Application No. 10-2018-0012323 filed on Jan. 31, 2018, the contents of which are hereby incorporated by reference herein in its entirety.

BACKGROUND OF THE INVENTION

Field of the Invention

The present disclosure relates to a multi-display device.

Discussion of the Related Art

Digital signage is a communication tool that can induce marketing, advertising, training effects and customer experience of companies. It is a display device that provides specific information as well as broadcast programs in public places such as airports, hotels, hospitals, and subway stations.

The digital signage is a medium that displays various content and commercial advertisements by installing display devices such as a liquid crystal display (LCD), a plasma display panel (PDP), and an organic light emitting diode (OLED) in outdoor certain places or street furniture. The digital signage can now be installed on all moving lines, where the public moves, such as apartment elevators, subway stations, subways, buses, universities, banks, convenience stores, discount stores, shopping malls.

When configuring a single screen using a plurality of display panels or display devices, the digital signage has a problem that a screen distortion occurs due to a difference in level between adjacent display panels in an up-down direction or in a left-right direction.

SUMMARY OF THE INVENTION

One object of the present disclosure is to solve the above-mentioned problems and other problems. Another object of the present disclosure may be to provide a multi-display device capable of adjusting a height difference or a level difference between adjacent display modules.

According to one aspect of the present disclosure, there is provided a multi-display device including a display module; a frame positioned behind the display module; a displacement adjustment unit positioned between the display module and the frame, mounted on the display module or the frame, and configured to adjust a distance between the display module and the frame; and an attachment part disposed on an upper surface of the displacement adjustment unit and attached to or detached from the frame or the display module.

According to another aspect of the present disclosure, the display module may include a first display module and a second display module arranged to be adjacent to the first display module in an up-down direction and or a left-right direction. The plurality of displacement adjustment units may be disposed respectively behind the first display module and the second display module, and adjust a first distance between the first display module and the frame or a second distance between the second display module and the frame.

According to another aspect of the present disclosure, the attachment part may be a magnetic material or a double-sided tape.

According to another aspect of the present disclosure, the frame may include a mounting hole positioned at each corner of the frame, and the displacement adjustment unit may be inserted into the mounting hole and mounted to the mounting hole.

According to another aspect of the present disclosure, the displacement adjustment units may rotate in a first direction or a second direction opposite the first direction. When the displacement adjustment unit rotates in the first direction, a first distance and a second distance may be gradually longer. When the displacement adjustment unit rotates in the second direction, the first distance and the second distance may be gradually shortened.

According to another aspect of the present disclosure, the display module may include a display panel, a module cover disposed behind the display panel, and a mounting part disposed in an inner space of the module cover. The displacement adjustment unit may be inserted into the mounting part and mounted to the mounting part.

According to another aspect of the present disclosure, the multi-display device may further include an adjustment part capable of adjusting the displacement adjustment unit. The adjustment part may be spaced apart in a thickness direction of the displacement adjustment unit and the display module, and disposed in front of the display panel.

According to another aspect of the present disclosure, when the adjustment part rotates in the first direction, the displacement adjustment unit may rotate in the first direction under control of the adjustment part. When the adjustment part rotates in the second direction, the displacement adjustment unit may rotate in the second direction under control of the adjustment part.

According to another aspect of the present disclosure, the attachment part may include a plurality of first magnetic parts and a plurality of second magnetic parts having a polarity different from a polarity of the first magnetic part. The plurality of first and second magnetic parts may be disposed on an upper surface of the displacement adjustment unit and alternately arranged.

According to another aspect of the present disclosure, the displacement adjustment unit may include a moving part facing a back surface of the display module, a housing part disposed to surround the moving part, and a sliding part fastened to a back surface of the housing part.

According to another aspect of the present disclosure, the sliding part may include a sliding body fastened to the back surface of the housing and an extension part extended from an upper side of the sliding body. The extension part may have an inclined surface inclined at a constant angle.

According to another aspect of the present disclosure, the adjustment part may adjust the distance between the display module and the frame by adjusting the moving part in the up-down direction.

According to another aspect of the present disclosure, the frame may include a mounting hole formed to be long in the up-down direction on a front surface of the frame. The displacement adjustment unit may include a first fastening part disposed on an upper side of an inside of the mounting hole, a second fastening part spaced apart from the first fastening part in the up-down direction and disposed on a lower side of the inside of the mounting hole, a belt part disposed to surround an outer peripheral surface of the first fastening part and an outer peripheral surface of the second fastening part, and a moving part mounted on the belt part.

According to another aspect of the present disclosure, the adjustment part may adjust the distance between the display module and the frame while the first fastening part and the second fastening part rotate when the moving part is adjusted in the up-down direction.

According to another aspect of the present disclosure, the adjustment part may include a magnetic material.

According to an embodiment of the present disclosure, it is possible to adjust a height difference or a level difference between adjacent display modules.

According to an embodiment of the present disclosure, it is possible to prevent the display screen from being distorted by adjusting the height difference or the level difference between adjacent display modules.

Additional scope of applicability of the invention will become apparent from the following detailed description. However, since various changes and modifications within the spirit and scope of the invention can be understood by those skilled in the art, it should be understood that specific embodiments, such as the detailed description and the preferred embodiments of the invention, are given as examples.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
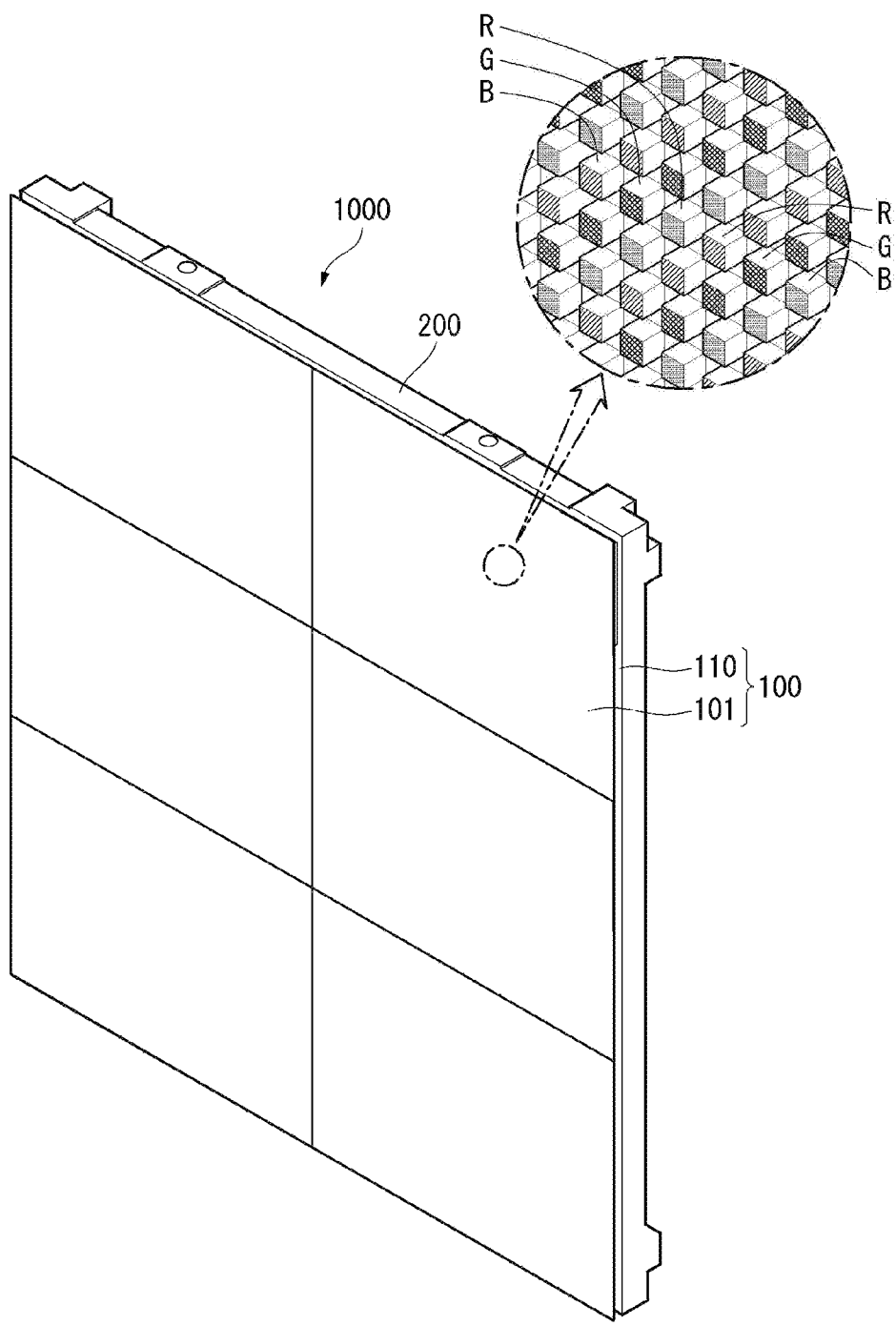
FIGS. 1 to 3 are views showing an example of a multi-display device according to an embodiment of the present disclosure.

Reference will now be made in detail embodiments of the invention examples of which are illustrated in the accompanying drawings. Since the present invention may be modified in various ways and may have various forms, specific embodiments are illustrated in the drawings and are described in detail in the present specification. However, it should be understood that the present invention are not limited to specific disclosed embodiments, but include all modifications, equivalents and substitutes included within the spirit and technical scope of the present invention.

The terms 'first', 'second', etc. may be used to describe various components, but the components are not limited by such terms. The terms are used only for the purpose of distinguishing one component from other components. For example, a first component may be designated as a second component without departing from the scope of the present invention. In the same manner, the second component may be designated as the first component.

The term "and/or" encompasses both combinations of the plurality of related items disclosed and any item from among the plurality of related items disclosed.

When an arbitrary component is described as "being connected to" or "being linked to" another component, this should be understood to mean that still another component(s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application are used to describe only specific embodiments or examples, and are not intended to limit the present invention. A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the present invention pertains. The terms defined in a generally used dictionary must be understood to have meanings identical to those used in the context of a related art, and are not to be construed to have ideal or excessively formal meanings unless they are obviously specified in the present application.

The following exemplary embodiments of the present invention are provided to those skilled in the art in order to describe the present invention more completely. Accordingly, shapes and sizes of elements shown in the drawings may be exaggerated for clarity.

Hereinafter, the embodiments of the invention are described using a liquid crystal display panel as an example of a display panel. Other display panels may be used. For example, a plasma display panel (PDP), a field emission display (FED) panel, and an organic light emitting diode (OLED) display panel may be used.

Figure 2:
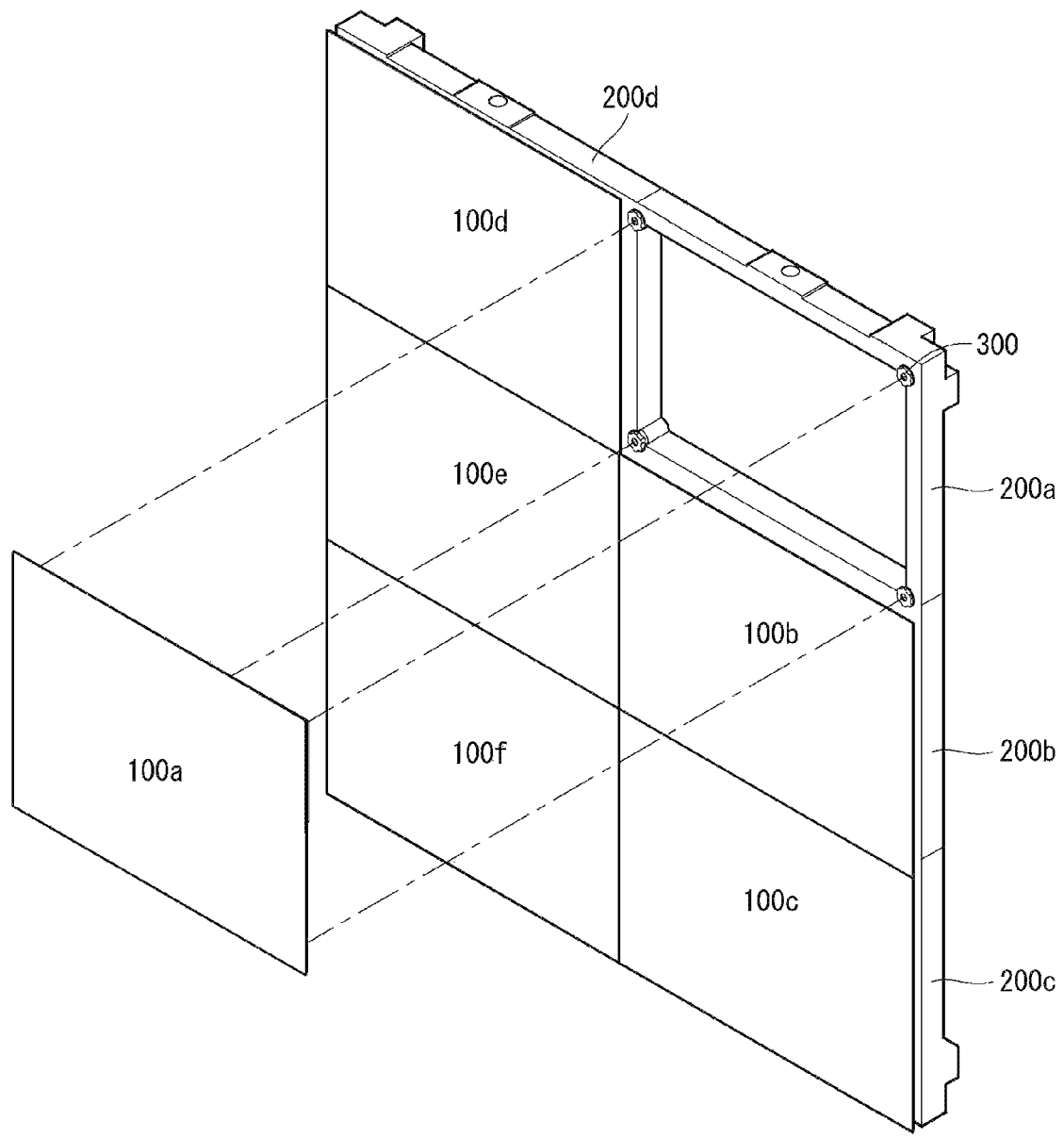

Referring to FIGS. 1 and 2, a multi-display device 1000 may include a display module 100 capable of displaying images, a frame 200 supporting the display module 100, and a displacement adjustment unit 300 mounted between the display module 100 and the frame 200 to adjust a distance therebetween, The display module 100 may include a display panel 101 and a module cover 110 positioned behind the display panel 101.

The display panel 101 may include a plurality of pixels R, G, B. The plurality of pixels R, G, and B may be formed in each region where a plurality of data lines and a plurality of gate lines cross. The plurality of pixels R, G, B may be disposed or arranged in a matrix form.

For example, the plurality of pixels R, G, and B may include a red (R) sub-pixel, a green (G) sub-pixel, and a blue (B) sub-pixel. The plurality of pixels R, G, and B may further include a white (hereinafter, 'W') sub-pixel.

In the display panel 101, a side on which images can be observed may be referred to as a front side or a front surface. When the display panel 101 displays the images, a side on which the images cannot be observed may be referred to as a back side or a back surface. When looking at the display panel 101 from the front side or the front surface, an upper part may be referred to as an upper side or an upper surface. Similarly, a lower part may be referred to as a lower side or a lower surface. Similarly, a right part may be referred to as a right side or a right surface, and a left part may be referred to as a left side or a left surface.

The module cover 110 may be disposed behind the display panel 101 to protect the back surface of the display panel 101 from outside.

The display module 100 may include a first display module 100a to a sixth display module 100f. The first display module 100a to the sixth display module 100f may be arranged to be adjacent to each other in an up-down direction and a left-right direction.

For example, the first display module 100a may be disposed on an upper right side of the frame 200. The second display module 100b may be disposed below the first display module 100a. The third display module 100c may be disposed below the second display module 100b. The fourth display module 100d may be disposed on the left side of the first display module 100a. The fifth display module 100e may be disposed below the fourth display module 100d and on the left side of the second display module 100b. The sixth display module 100f may be disposed below the fifth display module 100e and on the left side of the third display module 100c.

The frame 200 may be disposed behind the plurality of display modules 100. A front surface of the frame 200 may face the back surface of the display module 100. The frame 200 may be disposed to correspond to the display module 100 in a thickness direction or a back-and-forth direction of the display module 100. The frame 200 may be formed in a frame shape in which a central region is opened. The frame 200 may be formed to be long in the up-down direction and the left-right direction so that the plurality of display modules 100 may be mounted. For example, a length of an upper side of the frame 200 may be substantially the same as a sum of a length of the upper side of the first display module 100a and a length of the upper side of the fourth display module 100d. A length of a right side of the frame 200 may be substantially the same as a sum of a length of the right side of the first display module 100a, a length of the right side of the second display module 100b, and a length of the right side of the third display module 100c. But it is not limited thereto. The frame 200 may be formed to be longer or shorter than the display module 100 according to an external environment such as a building or a wall to be installed.

The frame 200 may have a thickness greater than a thickness of the plurality of display modules 100.

Although one frame 200 is shown in FIGS. 1 and 2, but it is not limited thereto. The frame 200 may include a first frame 200a to a sixth frame 200f. For example, the first frame 200a to the sixth frame 200f may be stacked or assembled in substantially the same manner as the first display module 100a to the sixth display module 100f described above. Thus, the n-th display module 100 may be mounted on the n-th frame 200, where n may be a natural number.

The displacement adjustment unit 300 may be disposed between the plurality of display modules 100 and the frame 200. The displacement adjustment unit 300 may be mounted on the frame 200 in the thickness direction of the display module 100. The displacement adjustment unit 300 mounted on the front surface of the frame 200 may be attached to the back surface of the display module 100. The displacement adjustment unit 300 can adjust a distance between the back surface of the display module 100 and the front surface of the frame 200. The displacement adjustment unit 300 may be a plurality of displacement adjustment units. The displacement adjustment unit 300 may be disposed at each of corners of the frame 200. The displacement adjustment unit 300 may be disposed at each corner of the display module 100 and the frame 200, and can adjust the distance therebetween.

Figure 3:
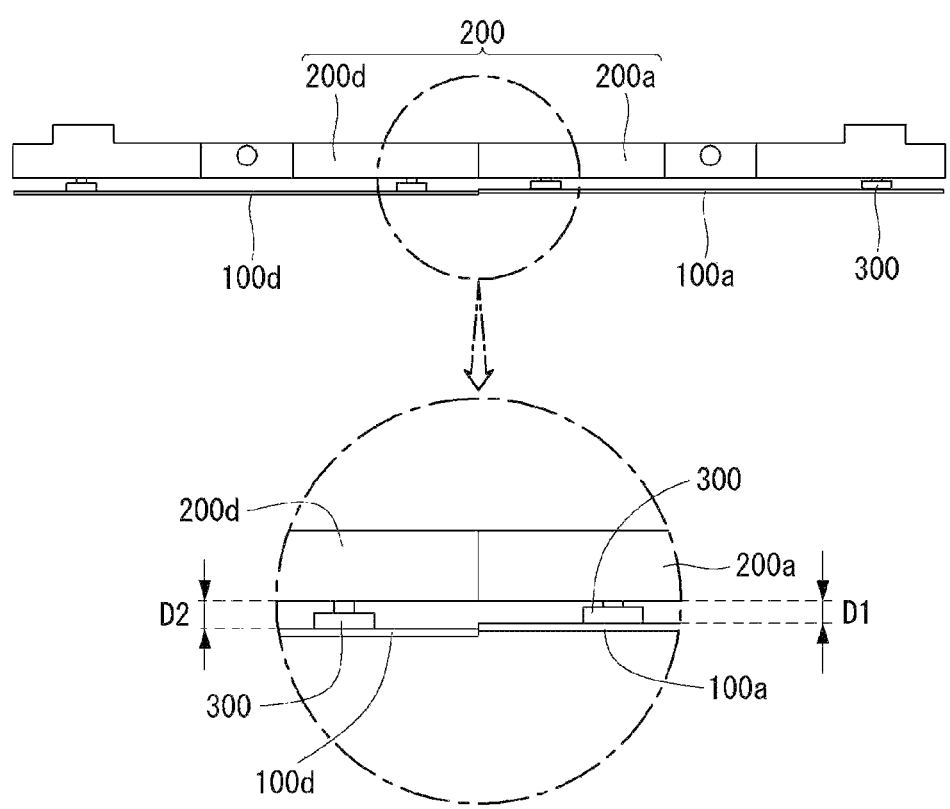

Referring to FIG. 3, a plurality of displacement adjustment units 300 may be mounted on the first frame 200 and attached to the first display module 100a. The plurality of displacement adjustment units 300 may be mounted on the fourth frame 200 and attached to the fourth display module 100d.

A distance D1 between the first display module 100a and the first frame 200a may be a right distance D1, and a distance D2 between the fourth display module 100d and the fourth frame 200 may be a left distance D2.

The displacement adjustment unit 300 may adjust one of the right distance D1 or the left distance D2, or adjust both the right distance D1 and the left distance D2 to adjust these values equally.

Thus, the displacement adjustment unit 300 can reduce a height difference or a level difference between the adjacent first display module 100a and fourth display module 100d.

Figure 4:
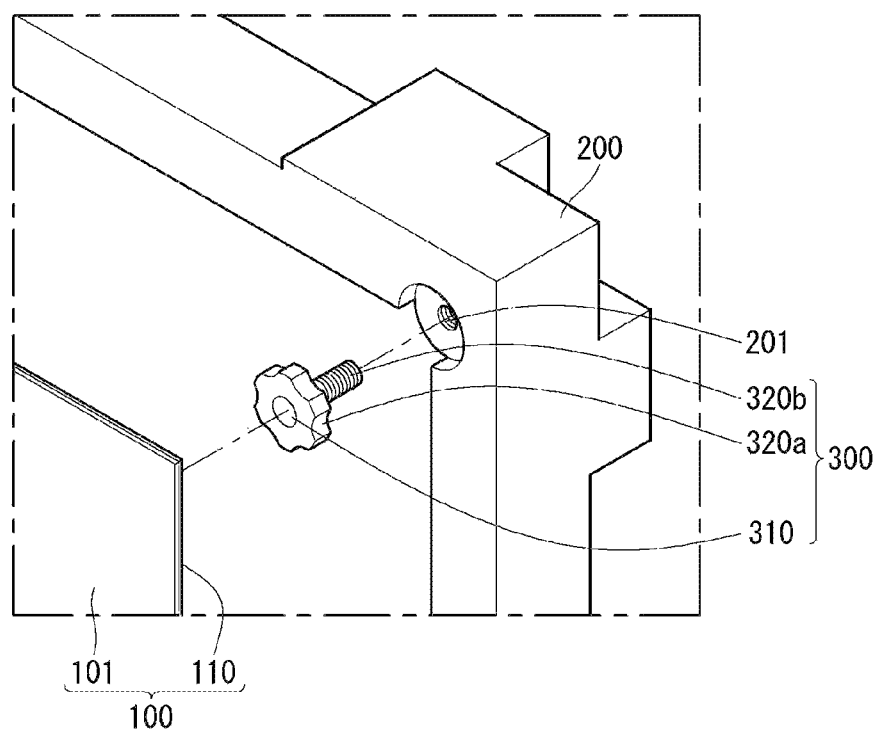
FIGS. 4 to 8 are views showing a multi-display device according to a first embodiment of the present disclosure.
Figure 5:
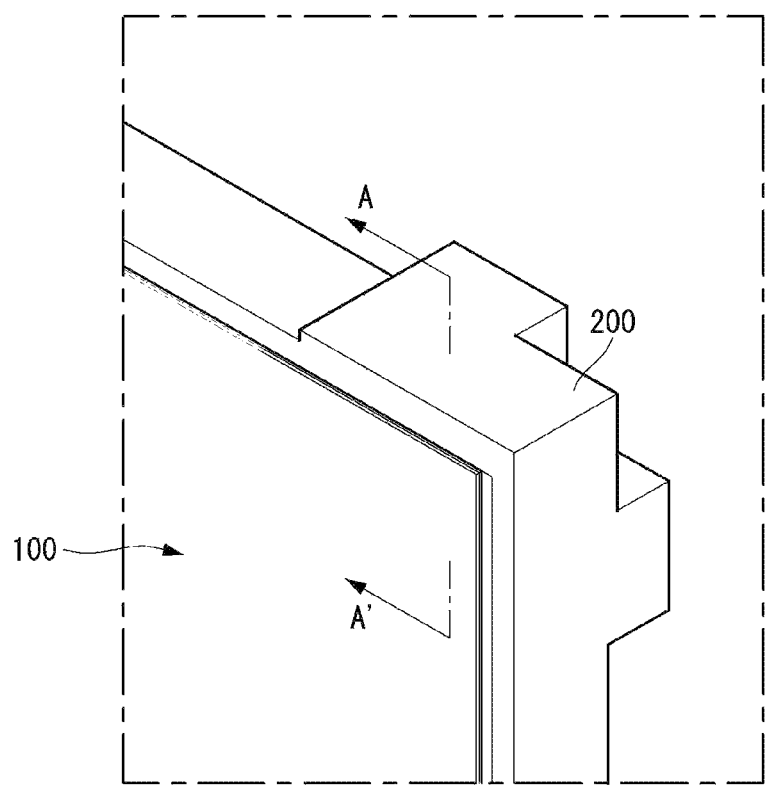
Figure 6:
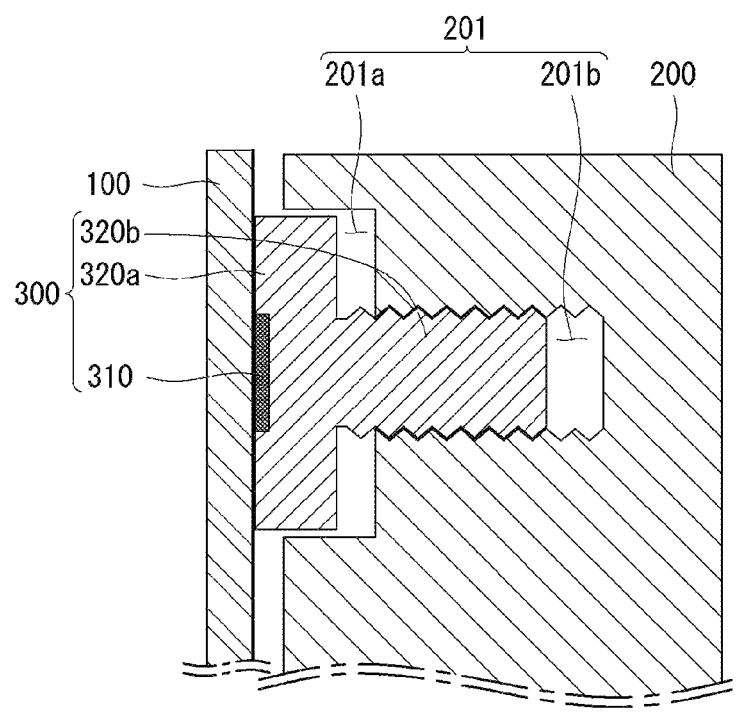

Referring to FIGS. 4 to 6, one of corners of the frame 200 is enlarged. For example, an upper right corner of the first frame 200 is enlarged. This will be mainly described below.

The displacement adjustment unit 300 may include a head part 320a and a body part 320b.

The head part 320a may be formed as a cylinder having a predetermined diameter and a predetermined thickness. The head part 320a may include an adjustment valley. The adjustment valley may be concave toward a center line of the head part 320a. The adjustment valley may be spaced apart at regular intervals along an outer surface or outer peripheral surface of the head part 320a. An upper surface of the head part 320a may face the back surface of the display module 100.

The body part 320b may be disposed on a lower surface or a lower side surface of the head part 320a. The body part 320b may be formed to be long in the thickness direction or the back and forth direction from the lower surface of the head part 320a. The body part 320b may have a diameter smaller than the diameter of the head part 320a. The body part 320b may include a screw thread. The screw thread having a constant pitch may be formed on an outer peripheral surface of the body part 320b.

An attachment part 310 may be disposed on an upper surface or an upper side surface of the displacement adjustment unit 300. The attachment part 310 may be disposed on the upper surface of the head part 320a and may be attached to the back surface of the display module 100 or may be detached from the back surface of the display module 100. For example, the attachment part 310 may be a magnetic material or a double-sided tape or the like. The attachment part 310 may be referred to as an attachment unit 310.

The frame 200 may include a plurality of mounting holes 201. The plurality of mounting holes 201 may be disposed on the front surface of the frame 200. At least one mounting hole 201 may be disposed in each of the corners of the frame 200. The mounting holes 201 may be concave toward a back surface of the frame 200 from the front surface of the frame 200.

The displacement adjustment unit 300 may be inserted into the mounting hole 201 and mounted to the mounting hole. The mounting hole 201 may include an upper hole 201a formed to correspond to the diameter of the head part 320a and a lower hole 201b formed to correspond to the diameter of the body part 320b.

Figure 7:
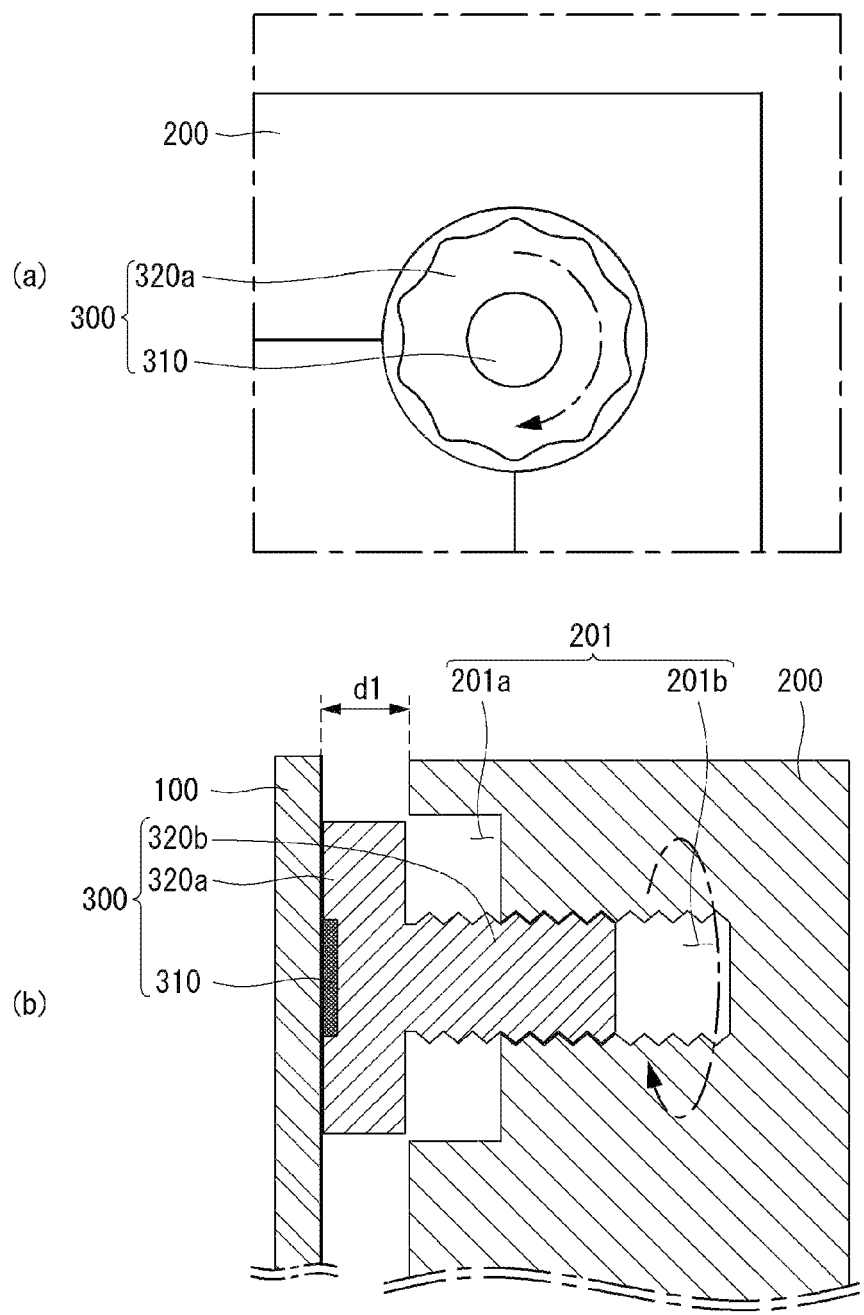
Figure 8:
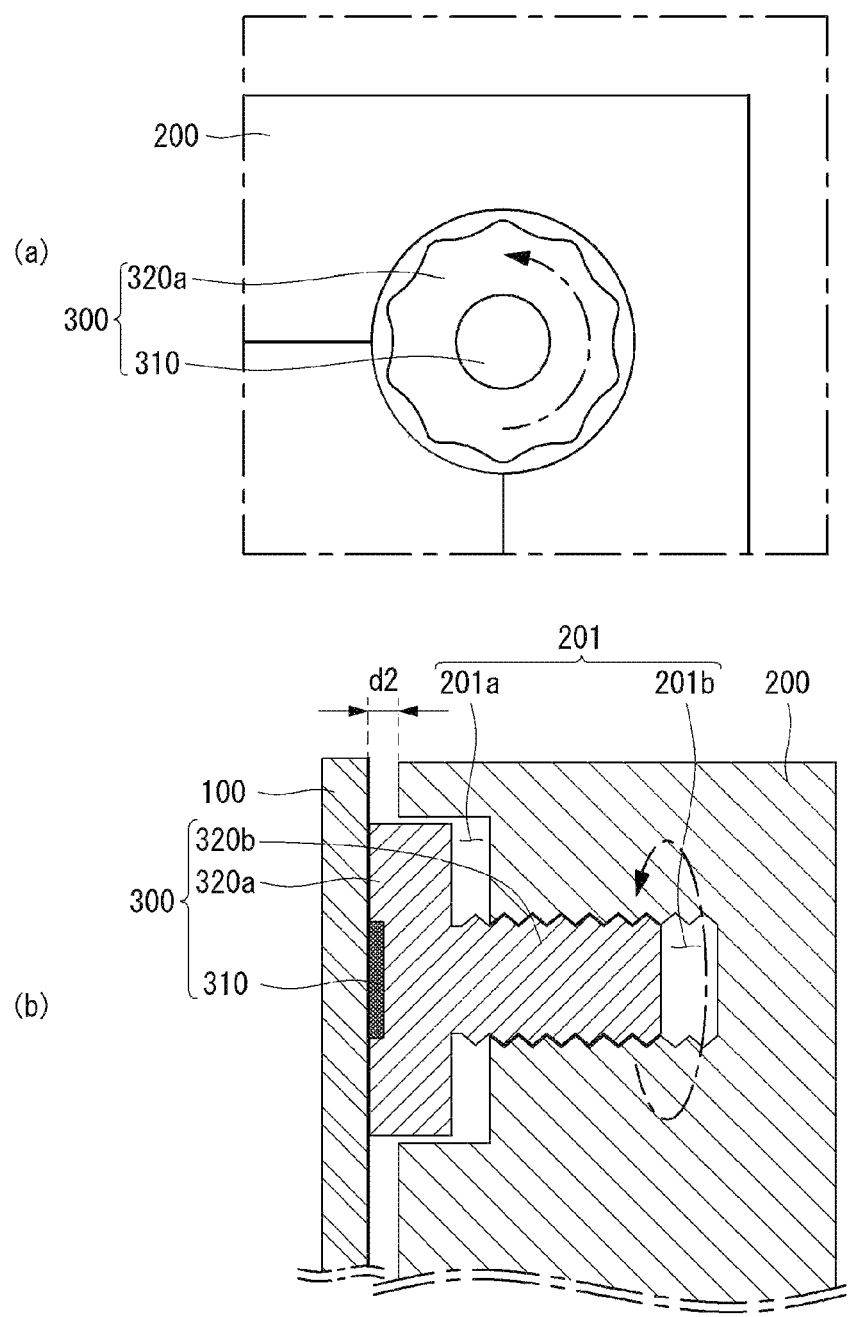

Referring to FIGS. 7 and 8, the displacement adjustment unit 300 may be rotated in a first direction or a second direction. The second direction may be opposite the first direction. The first direction may be referred to as a clockwise direction, and the second direction may be referred to as a counterclockwise direction.

As shown in FIG. 7 (a), the displacement adjustment unit 300 may be rotated in the first direction. When the displacement adjustment unit 300 is rotated in the first direction, as shown in FIG. 7 (b), the displacement adjustment unit 300 may protrude from the mounting hole 201 toward the display module 100. A distance between the back surface of the display module 100 and the front surface of the frame 200 may be spaced apart by a first length d1. The first length d1 may be referred to as a first distance d1. The first distance d1 may be gradually longer.

As shown in FIG. 8 (a), the displacement adjustment unit 300 may be rotated in the second direction. When the displacement adjustment unit 300 is rotated in the second direction, as shown in FIG. 8 (b), the displacement adjustment unit 300 may be inserted into the mounting hole 201 toward the back of the frame 200. The distance between the back surface of the display module 100 and the front surface of the frame 200 may be spaced apart by a second length d2. The second length d2 may be referred to as a second distance d2. The second distance d2 may be gradually shortened.

As described above, the distance between the display module 100 and the frame 200 can be easily adjusted as the displacement adjustment unit 300 rotates in the first direction or the second direction.

Figure 9:
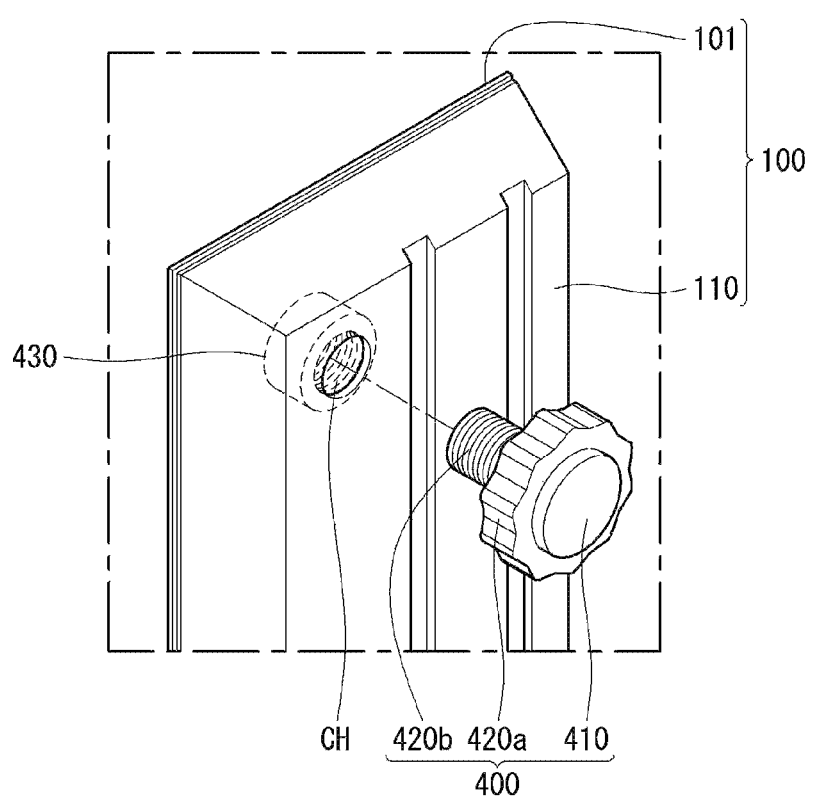
FIGS. 9 to 12 are views showing a multi-display device according to a second embodiment of the present disclosure.
Figure 10:
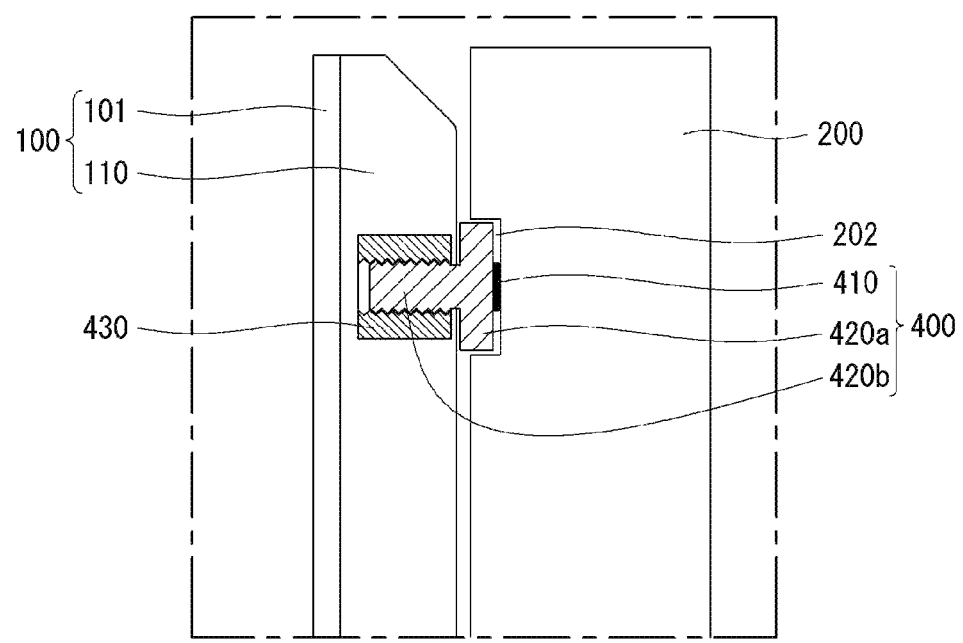

Referring to FIGS. 9 and 10, a display module 100 may include a display panel 101 and a module cover 110 disposed behind the display panel 101.

A displacement adjustment unit 400 may be mounted on the module cover 110. The displacement adjustment unit 400 may include a head part 420a and a body part 420b.

An attachment part 410 may be disposed on an upper surface or an upper side surface of the displacement adjustment unit 400. The attachment part 410 is disposed on the upper surface of the head part 420a and may be attached to a front surface of a frame 200 or may be detached from the front surface of the frame 200. For example, the attachment part 410 may be a magnetic material or a double-sided tape or the like.

A mounting part 430 may be disposed in an inner space of the module cover 110. The mounting part 430 may have a diameter substantially equal to a diameter of the body part 420b. The mounting part 430 may include a screw thread. The screw thread having a constant pitch may be formed on an inner peripheral surface of the mounting part 430.

The module cover 110 may include a plurality of cover holes CH. The cover hole CH may penetrate the module cover 110. The cover hole CH may be disposed in the module cover 110 so as to correspond to the mounting part 430. The displacement adjustment unit 400 may be inserted into the mounting part 430 through the cover hole CH.

The frame 200 may include a plurality of frame grooves 202. The frame grooves 202 may be disposed on the front surface of the frame 200 and may be concave toward a back of the frame 200. The head part 420a of the displacement adjustment unit 400 may be inserted into the frame groove 202. The attachment part 410 may be attached to an inside of the frame groove 202.

As described above, the head part 420a of the displacement adjustment unit 400 may be attached to the frame groove 202 formed in the frame 200 through the attachment part 410, and the body part 420b of the displacement adjustment unit 400 may be inserted into the mounting part 430 built in the module cover 110 and mounted thereon.

Figure 11:
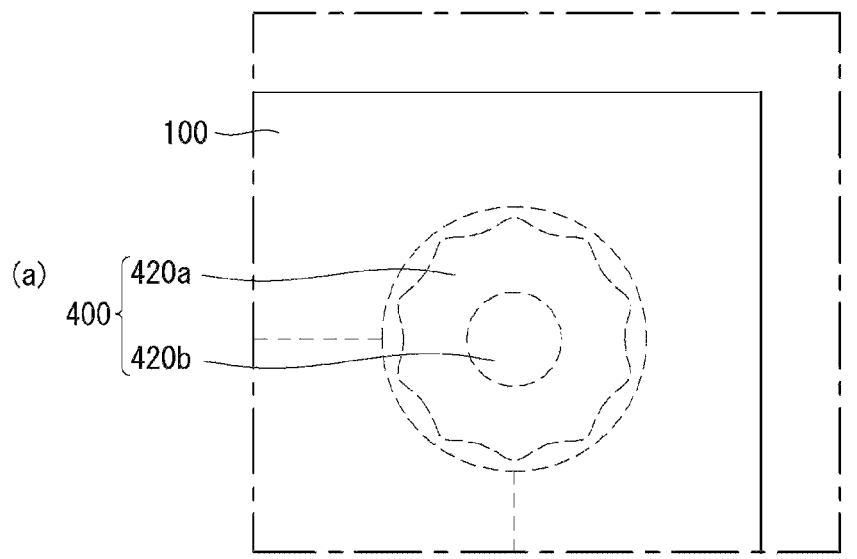
Figure 11:
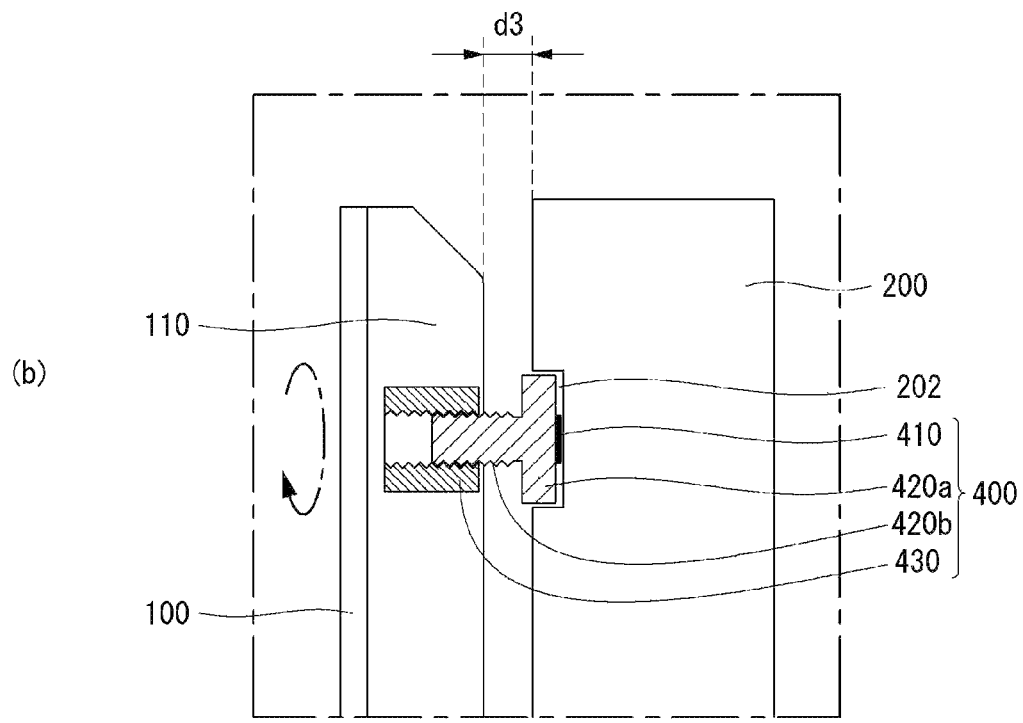
Figure 12:
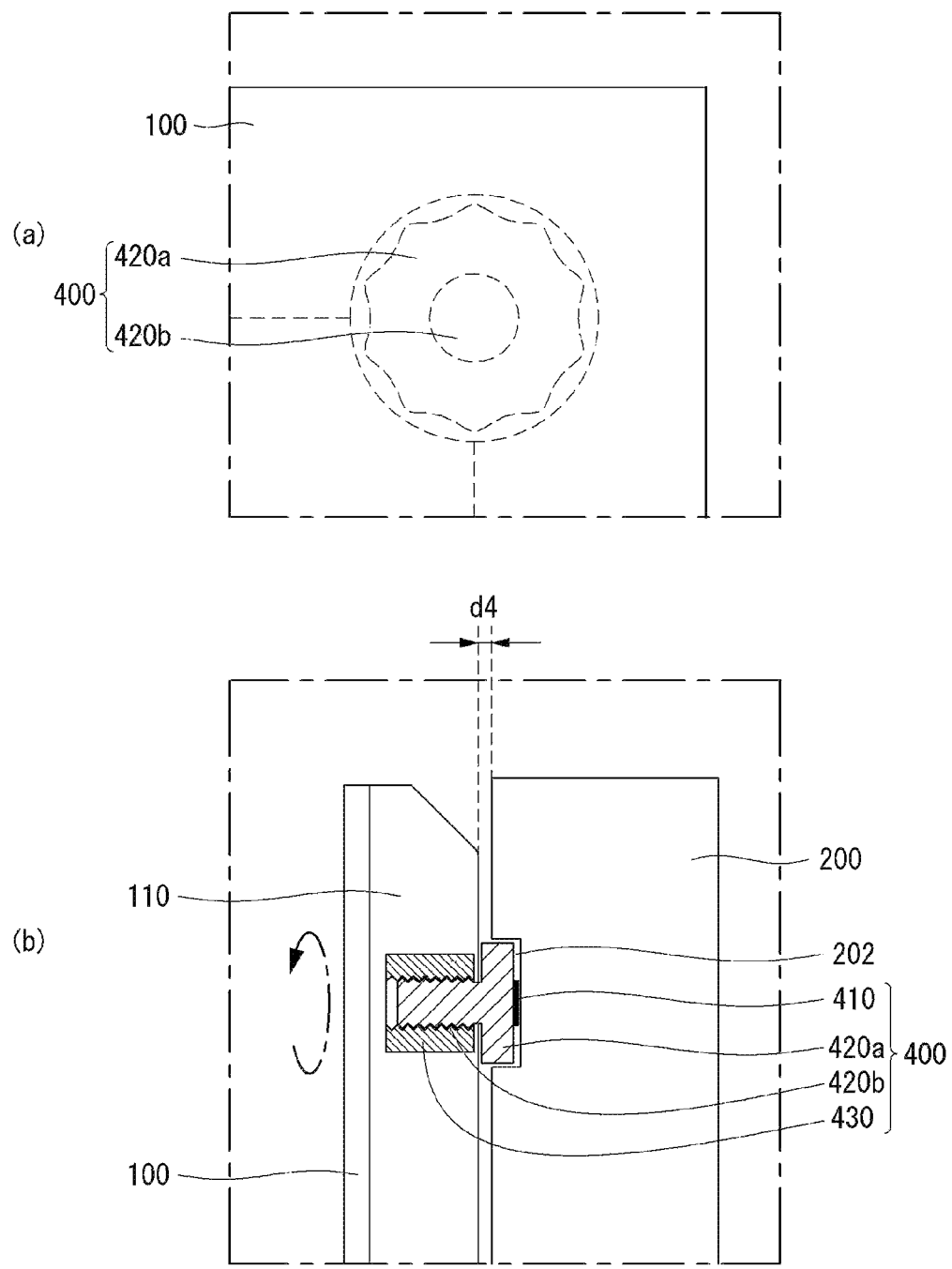

Referring to FIGS. 11 and 12, the displacement adjustment unit 400 may be rotated in a first direction or a second direction. The second direction may be opposite the first direction. The first direction may be referred to as a clockwise direction, and the second direction may be referred to as a counterclockwise direction.

As shown in FIG. 11 (a), the displacement adjustment unit 400 may be rotated in the first direction. When the displacement adjustment unit 400 is rotated in the first direction, as shown in FIG. 11 (b), the displacement adjustment unit 400 may protrude from the mounting part 430 toward the frame 200. A distance between the module cover 110 and the front surface of the frame 200 may be spaced apart by a third length d3. The third length d3 may be referred to as a third distance d3. The third distance d3 may be gradually longer.

As shown in FIG. 12 (a), the displacement adjustment unit 400 may be rotated in the second direction. When the displacement adjustment unit 400 is rotated in the second direction, as shown in FIG. 12 (b), the displacement adjustment unit 400 may be inserted into the mounting part 430 toward a front of the display module 100. The distance between the module cover 110 and the front surface of the frame 200 may be spaced apart by a fourth length d4. The fourth length d4 may be referred to as a fourth distance d4. The fourth distance d4 may be gradually shortened.

As described above, the distance between the module cover 110 and the frame 200 can be easily adjusted as the displacement adjustment unit 400 rotates in the first direction or the second direction.

Figure 13:
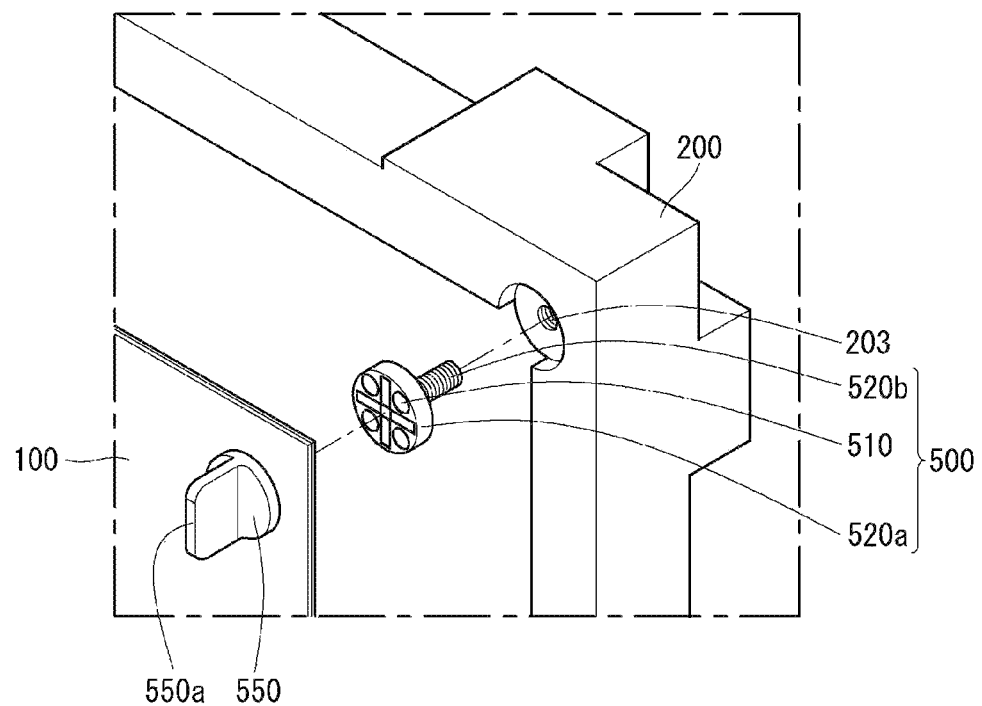
FIGS. 13 to 18 are views showing a multi-display device according to a third embodiment of the present disclosure.
Figure 14:
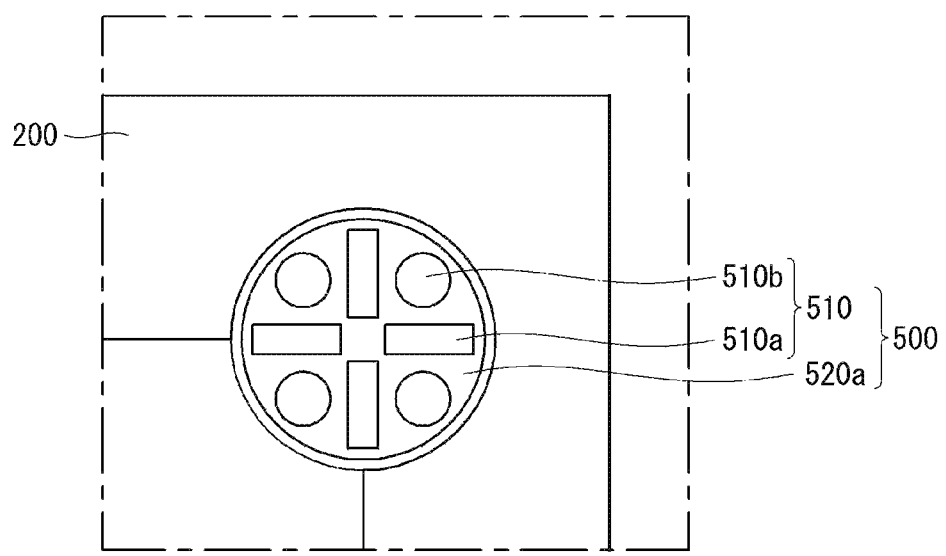
Figure 15:
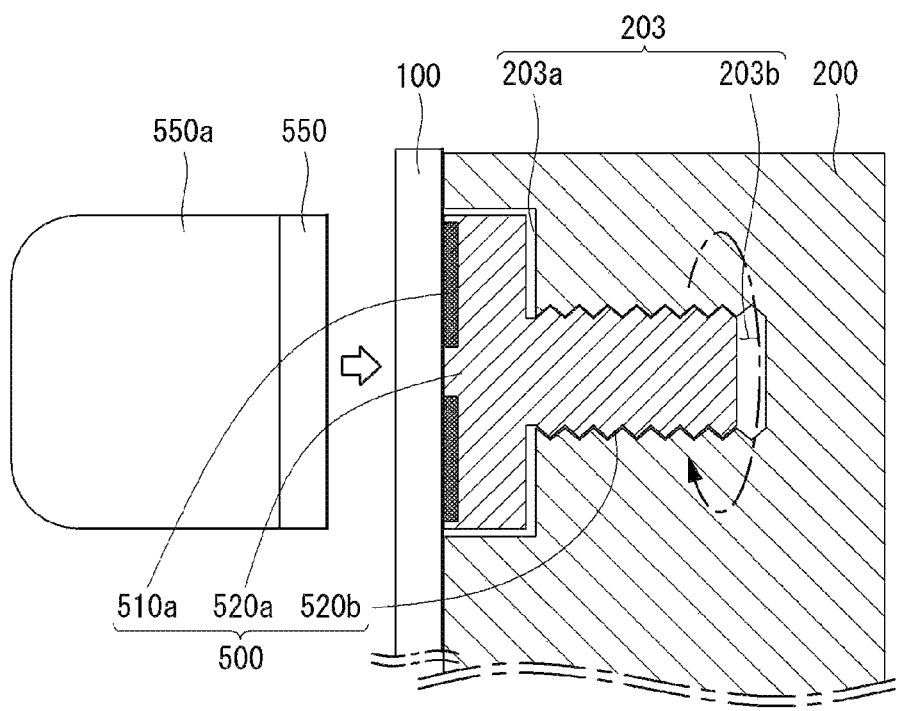

Referring to FIGS. 13 and 14, a displacement adjustment unit 500 may include a head part 520a and a body part 520b.

An attachment part 510 may be disposed on an upper surface or an upper side surface of the displacement adjustment unit 500. The attachment part 510 may be disposed on an upper surface of the head part 520a and may be attached to a back surface of a display module 100 or may be detached from the back surface of the display module 100. For example, the attachment part 510 may be a magnetic material.

The attachment part 510 may include a plurality of first magnetic parts 510a and a plurality of second magnetic parts 510b. The second magnetic part 510b may have a polarity different from that of the first magnetic part 510a. For example, if the first magnetic part 510a is a positive pole of a magnet, then the second magnetic part 510b may be a negative pole of the magnet. Conversely, if the first magnetic part 510a is a negative pole of a magnet, then the second magnetic part 510b may be a positive pole of the magnet.

The plurality of first and second magnetic parts 510a and 510b may be alternately arranged with respect to a center of the head part 520a.

For example, the plurality of first magnetic parts 510a may be arranged in an up-down direction and a left-right direction. The plurality of second magnetic parts 510b may be arranged between the plurality of first magnetic parts 510a.

An adjustment part 550 may be positioned or disposed in front of the display module 100. The adjustment part 550 may be a metallic material that can be attached to the magnetic material. The display module 100 may be disposed between the adjustment part 550 and the displacement adjustment unit 500.

Referring to FIGS. 15 to 18, the adjustment part 550 may be disposed to correspond to the displacement adjustment unit 500. The adjustment part 550 may be positioned to overlap with the displacement adjustment unit 500 in a thickness direction.

A cross-sectional area of the adjustment part 550 may be substantially equal to or larger than a cross-sectional area of the displacement adjustment unit 500. The displacement adjustment unit 500 can be rotated under control of the adjustment part 550.

The adjustment part 550 may include a handle 550*a*. The handle 550*a* may be disposed on an upper surface of the adjustment part 550. The handle 550*a* may be disposed to cross the adjustment part 550. For example, the handle 550*a* of the adjustment part 550 may be disposed in the up-down direction or a vertical direction.

Figure 16:
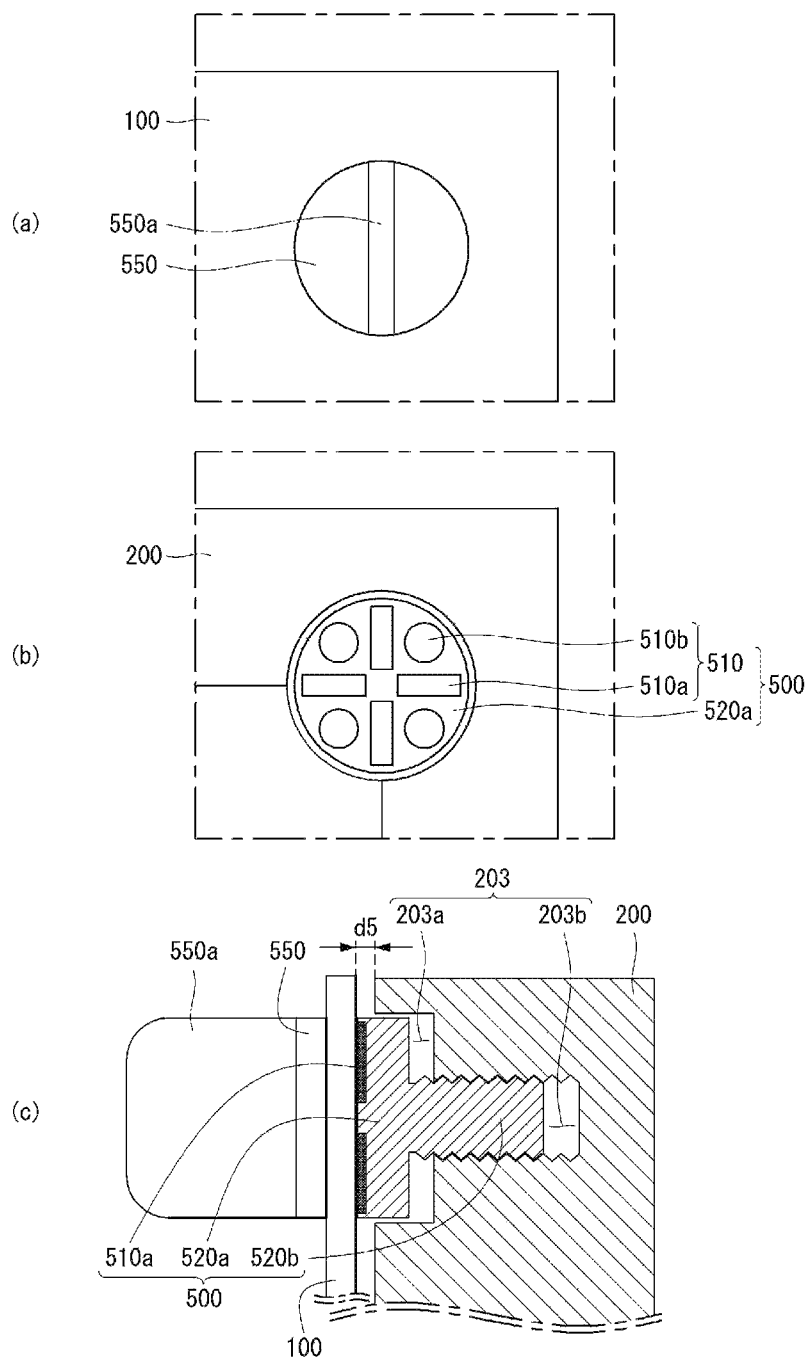

As shown in FIG. 16 (*a*), the adjustment part 550 may be in contact with or face the display module 100. The handle 550*a* of the adjustment part 550 may be disposed in the 6 o'clock position or the 12 o'clock position.

As shown in FIG. 16 (*b*), the displacement adjustment unit 500 may correspond to the adjustment part 550 and the plurality of first magnetic parts 510*a* may be disposed in the 3 o'clock, 6 o'clock, 9 o'clock, and 12 o'clock positions. The plurality of second magnetic parts 510*b* may be disposed between the plurality of first magnetic parts 510*a*.

As shown in FIG. 16 (*c*), a distance between the back surface of the display module 100 and a frame 200 may be spaced apart by a fifth length d5. The fifth length d5 may be referred to as a fifth distance d5.

The adjustment part 550 may be rotated in a first direction or a second direction. The second direction may be opposite the first direction. The first direction may be referred to as a clockwise direction, and the second direction may be referred to as a counterclockwise direction.

Figure 17:
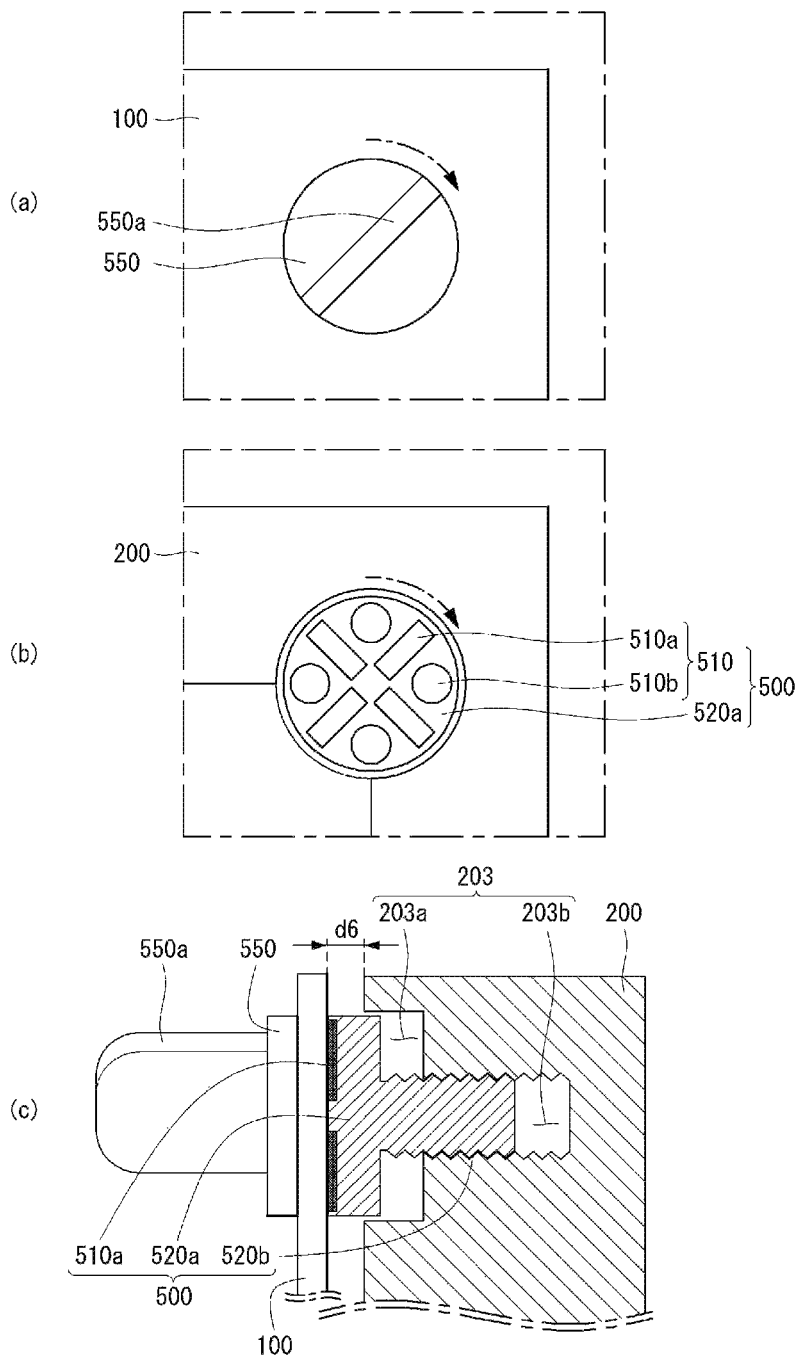

As shown in FIG. 17 (*a*), the adjustment part 550 being in contact with the display module 100 may be rotated in the clockwise direction. Accordingly, the handle 550*a* of the adjustment part 550 may be disposed between the 1 o'clock and 2 o'clock positions, or between the 7 o'clock and 8 o'clock positions.

As shown in FIG. 17 (*b*), under control of the adjustment part 550, the displacement adjustment unit 500 can be rotated. The displacement adjustment unit 500 can be rotated as long as the adjustment part 550 is rotated. Accordingly, the plurality of first magnetic parts 510*a* may be disposed between the 1 o'clock and 2 o'clock positions, or between the 7 o'clock and 8 o'clock positions.

As shown in FIG. 17 (*c*), a distance between the back surface of the display module 100 and the frame 200 may be spaced apart by a sixth length d6. The sixth length d6 may be referred to as a sixth distance d6. The sixth length d6 may be longer than the fifth length d5.

Figure 18:
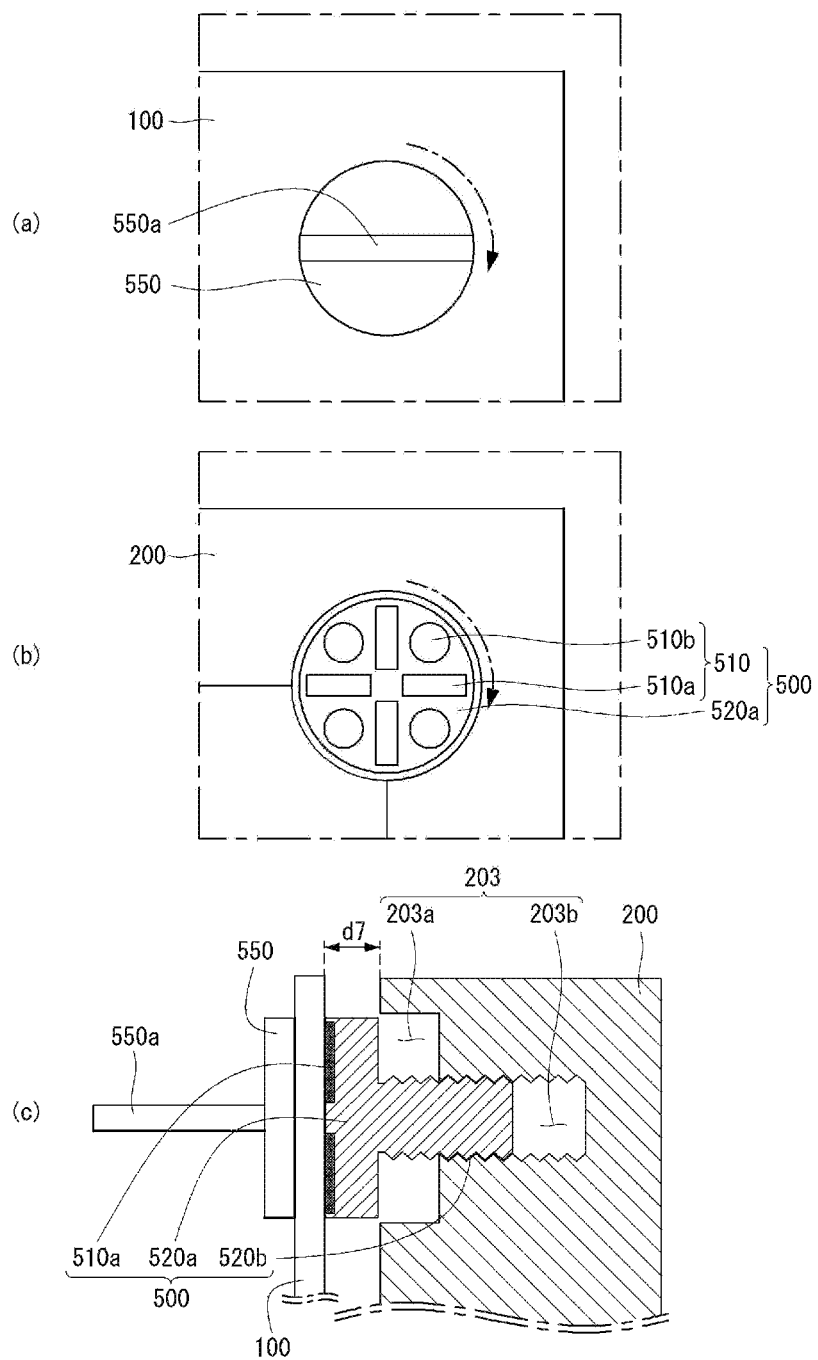

As shown in FIG. 18 (*a*), the adjustment part 550 being in contact with the display module 100 can be continuously rotated in the clockwise direction. Accordingly, the handle 550*a* of the adjustment part 550 may be disposed in the 3 o'clock or 9 o'clock positions.

As shown in FIG. 18 (*b*), under control of the adjustment part 550, the displacement adjustment unit 500 can be continuously rotated. The displacement adjustment unit 500 can be rotated as long as the adjustment part 550 is rotated. Accordingly, the plurality of first magnetic parts 510*a* may be disposed in the 3 o'clock or 9 o'clock positions.

As shown in FIG. 18 (*c*), a distance between the back surface of the display module 100 and the frame 200 may be spaced apart by a seventh length d7. The seventh length d7 may be referred to as a seventh distance d7. The seventh length d7 may be longer than the sixth length d6.

As described above, when the adjustment part 550 rotates in the first direction, the displacement adjustment unit 500 can be rotated in the first direction under control of the adjustment part 550. Accordingly, the distance between the back surface of the display module 100 and the frame 200 can be gradually longer.

Conversely, the adjustment part 550 can be rotated in the second direction. When the adjusting part 550 rotates in the second direction, the displacement adjustment unit 500 can be rotated in the second direction under control of the adjusting part 550. Accordingly, the distance between the back surface of the display module 100 and the frame 200 can be gradually shortened.

Figure 19:
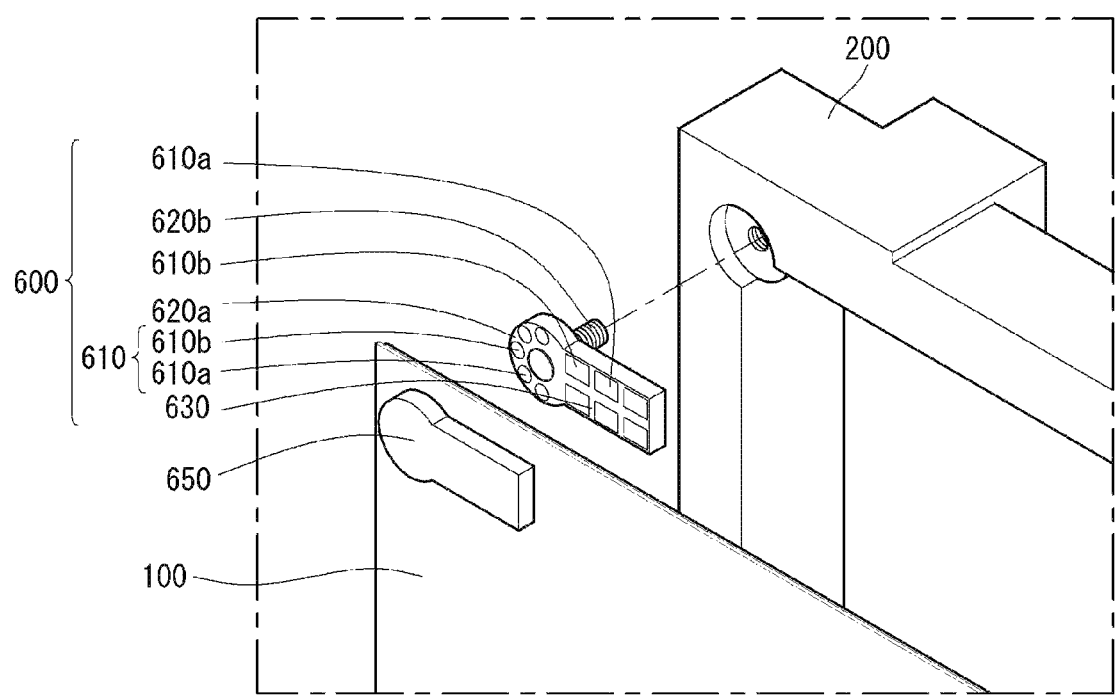
FIGS. 19 to 22 are views showing a multi-display device according to a fourth embodiment of the present disclosure.

Referring to FIG. 19, a displacement adjustment unit 600 may include a head part 620*a*, a body part 620*b*, and an adjustment bar 630.

The adjustment bar 630 may be extended from one side of the head part 620*a*. For example, the adjustment bar 630 may be extended to be long from the right side of the head part 620*a*.

An attachment part 610 may be disposed on an upper surface or an upper side surface of the displacement adjustment unit 600. The attachment part 610 may be disposed on the upper surface of the head part 620*a* and the adjustment bar 630, and attached to a back surface of a display module 100 or detached from the back surface of the display module 100. For example, the attachment part 610 may be a magnetic material.

The attachment part 610 may include a plurality of first magnetic parts 610*a* and a plurality of second magnetic parts 610*b*. The second magnetic part 610*b* may have a property different from that of the first magnetic par 610*a*. For example, if the first magnetic part 610*a* is a positive pole of a magnet, then the second magnetic part 610*b* may be a negative pole of the magnet.

The plurality of first and second magnetic parts 610*a* and 610*b* may be alternately arranged on the upper surface of the head part 620*a* and the upper surface of the adjustment bar 630.

An adjustment part 650 may be positioned or disposed in front of the display module 100. The adjustment part 650 may be a metallic material that can be attached to the magnetic material. The display module 100 may be disposed between the adjustment part 650 and the displacement adjustment unit 600.

The adjustment part 650 may be formed to have substantially the same shape as a shape of the displacement adjustment unit 600.

Figure 20:
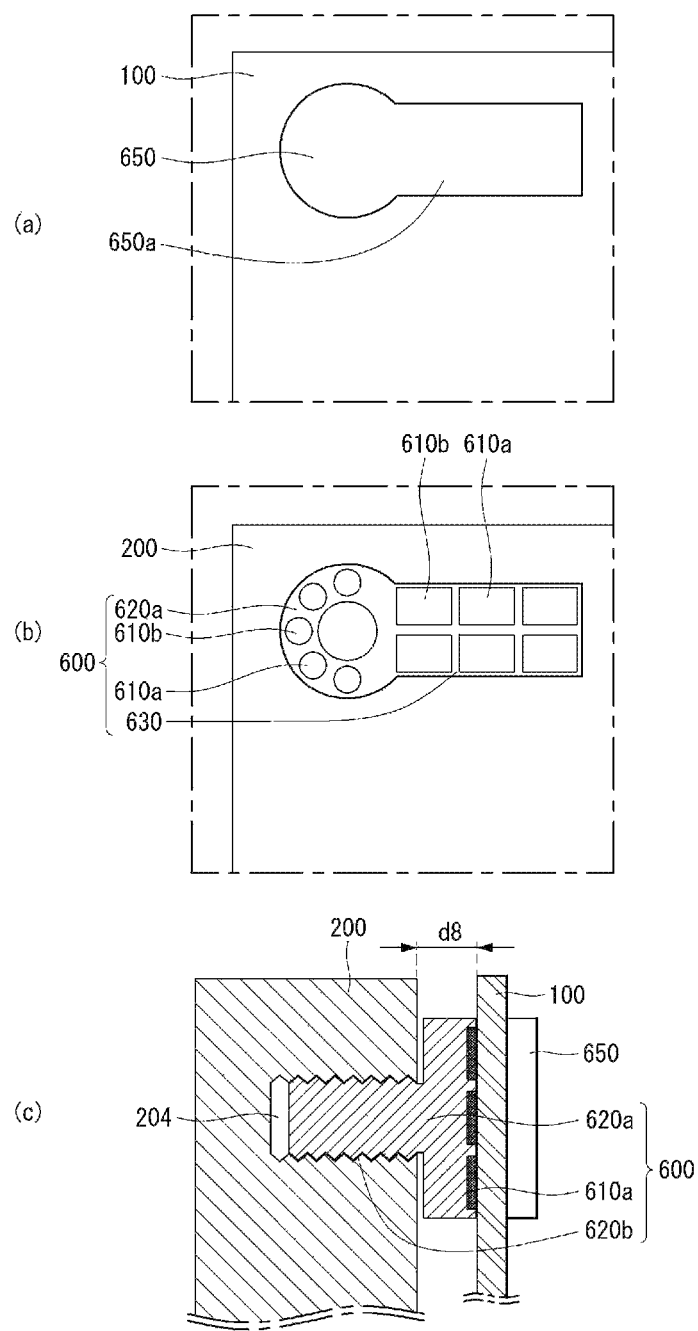
Figure 21:
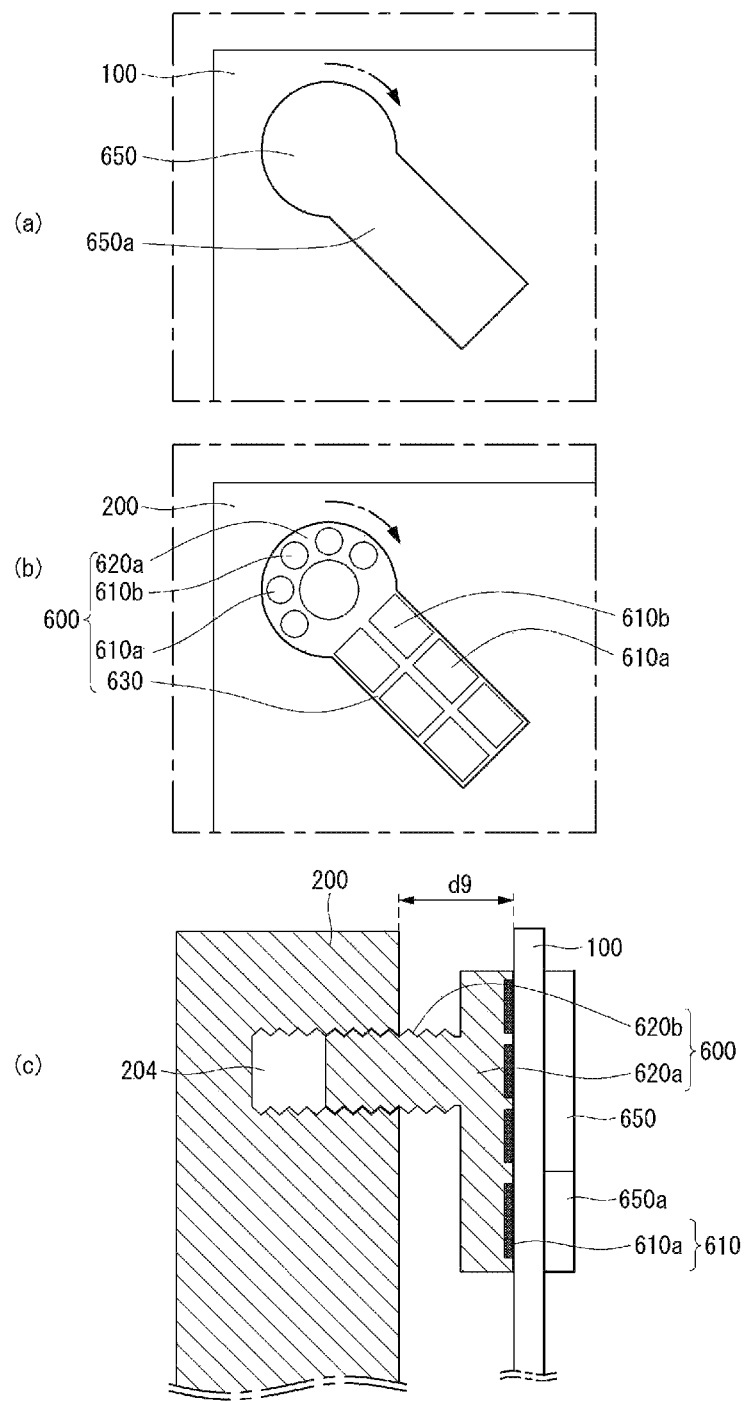
Figure 22:
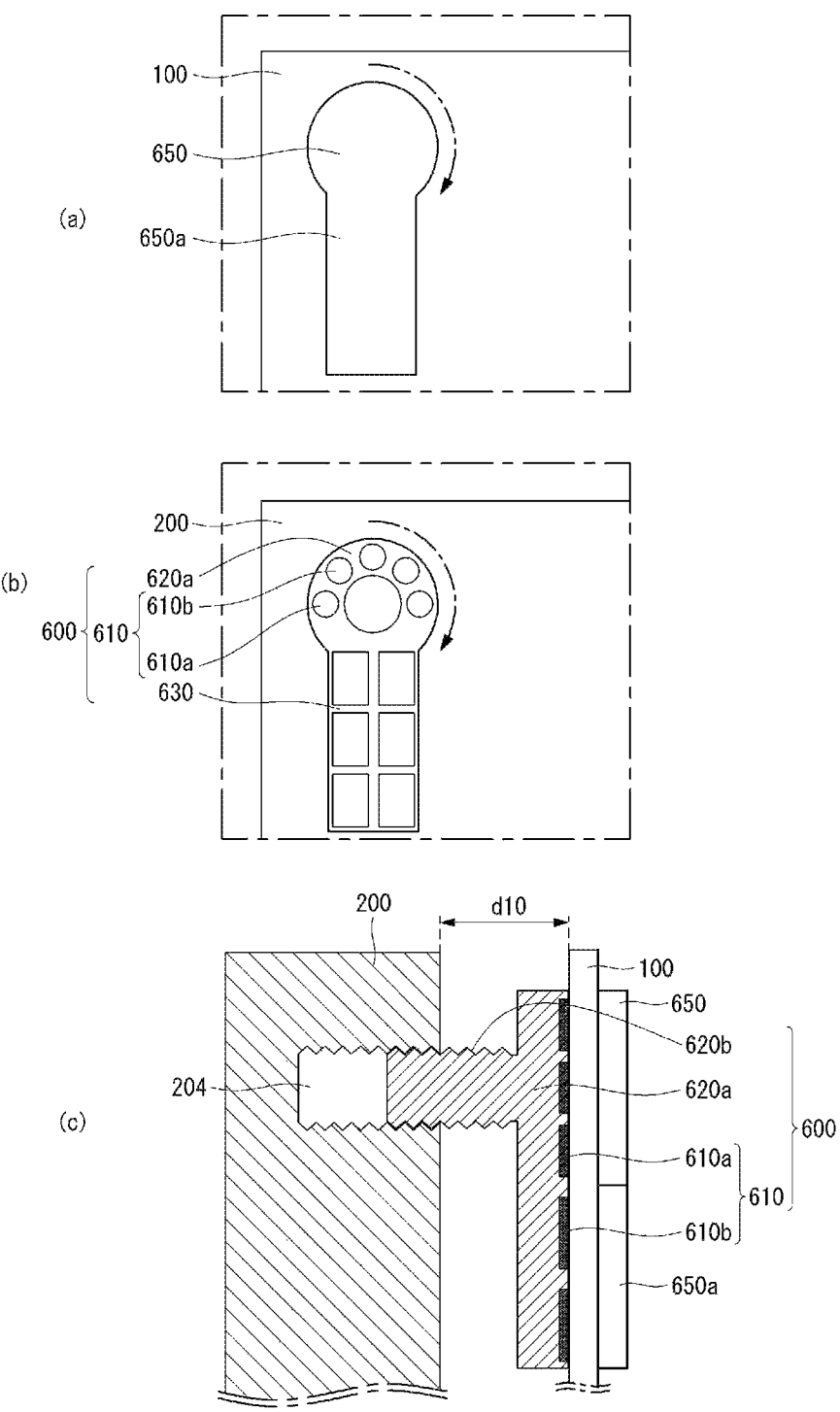

Referring to FIGS. 20 to 22, the adjustment part 650 may be disposed to correspond to the displacement adjustment unit 600. The adjusting part 650 may be positioned to overlap with the displacement adjustment unit 600 in a thickness direction.

A cross-sectional area of the adjustment part 650 may be substantially equal to or larger than a cross-sectional area of the displacement adjustment unit 600. The displacement adjustment unit 600 can be rotated under control of the adjustment part 650.

The adjustment part 650 may include an adjustment auxiliary bar 650*a*. The adjustment auxiliary bar 650*a* may be disposed on the right side of the adjustment part 650. For example, the adjustment auxiliary bar 650a may be disposed in a left-right direction or a horizontal direction.

As shown in FIG. 20 (a), the adjustment part 650 may be in contact with or face the display module 100. The adjustment auxiliary bar 650a may be disposed in the 3 o'clock position.

As shown in FIG. 20 (b), the displacement adjustment unit 600 may correspond to the adjustment part 650. Thus, the adjustment bar 630 may be disposed in the 3 o'clock position.

As shown in FIG. 20 (c), a distance between the back surface of the display module 100 and a frame 200 may be spaced apart by an eighth length d8. The eighth length d8 may be referred to as an eighth distance d.

The adjustment part 650 may be rotated in a first direction or a second direction. The second direction may be opposite the first direction. The first direction may be referred to as a clockwise direction, and the second direction may be referred to as a counterclockwise direction.

As shown in FIG. 21 (a), the adjustment part 650 being in contact with the display module 100 may be rotated in the clockwise direction. Therefore, the adjustment auxiliary bar 650a may be disposed between the 4 o'clock and 5 o'clock positions.

As shown in FIG. 21 (b), under control of the adjustment part 650, the displacement adjustment unit 600 can be rotated. The adjustment bar 630 of the displacement adjustment unit 600 can be rotated as long as the adjustment auxiliary bar 650a of the adjustment part 650 is rotated. Accordingly, the adjustment bar 630 may be disposed between the 4 o'clock and 5 o'clock positions.

As shown in FIG. 21 (c), a distance between the back surface of the display module 100 and the frame 200 may be spaced apart by a ninth length d9. The ninth length d9 may be referred to as a ninth distance d9. The ninth length d9 may be longer than the eighth length d8.

As shown in FIG. 22 (a), the adjustment part 650 being in contact with the display module 100 may be continuously rotated clockwise. Thus, the adjustment auxiliary bar 650a may be disposed in the 6 o'clock position.

As shown in FIG. 22 (b), under control of the adjustment part 650, the displacement adjustment unit 600 can be continuously rotated. The adjustment bar 630 of the displacement adjustment unit 600 can be rotated as long as the adjustment auxiliary bar 650a of the adjustment part 650 is rotated. Accordingly, the adjustment bar 630 may be disposed in the 6 o'clock position.

As shown in FIG. 22 (c), a distance between the back surface of the display module 100 and the frame 200 may be spaced apart by a tenth length d10. The tenth length d10 may be referred to as a tenth distance d10. The tenth length d10 may be longer than the ninth length d9.

As described above, when the adjustment part 650 rotates in the first direction, the displacement adjustment unit 600 can be rotated in the first direction under control of the adjustment part 650. Accordingly, the distance between the back surface of the display module 100 and the frame 200 can be gradually longer.

Conversely, the adjustment part 650 can be rotated in the second direction. When the adjustment part 650 rotates in the second direction, the displacement adjustment unit 600 can be rotated in the second direction under control of the adjustment part 650. Accordingly, the distance between the back surface of the display module 100 and the frame 200 can be gradually shortened.

Figure 23:
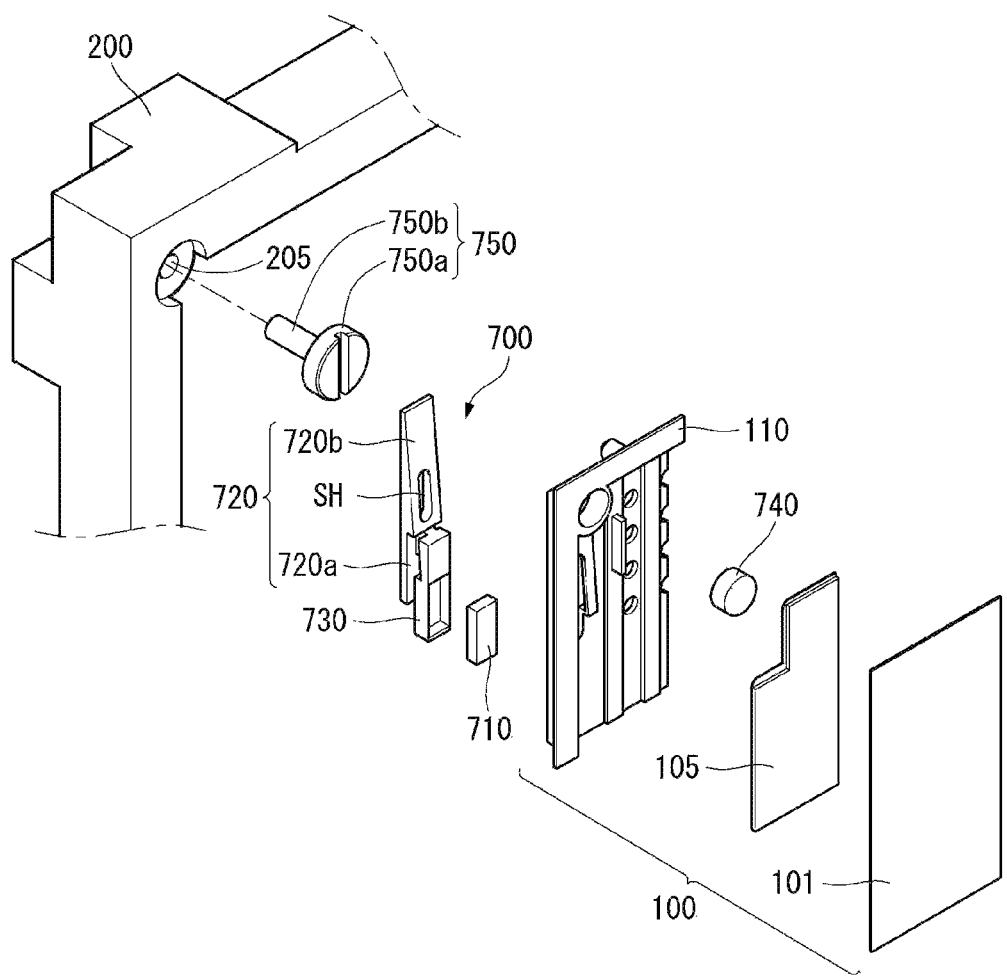
FIGS. 23 to 26 are views showing a multi-display device according to a fifth embodiment of the present disclosure.
Figure 24:
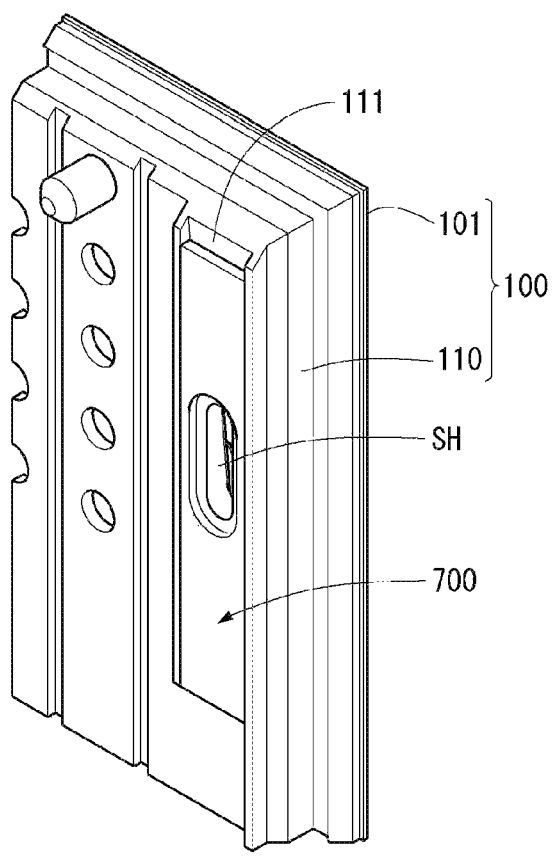
Figure 25:
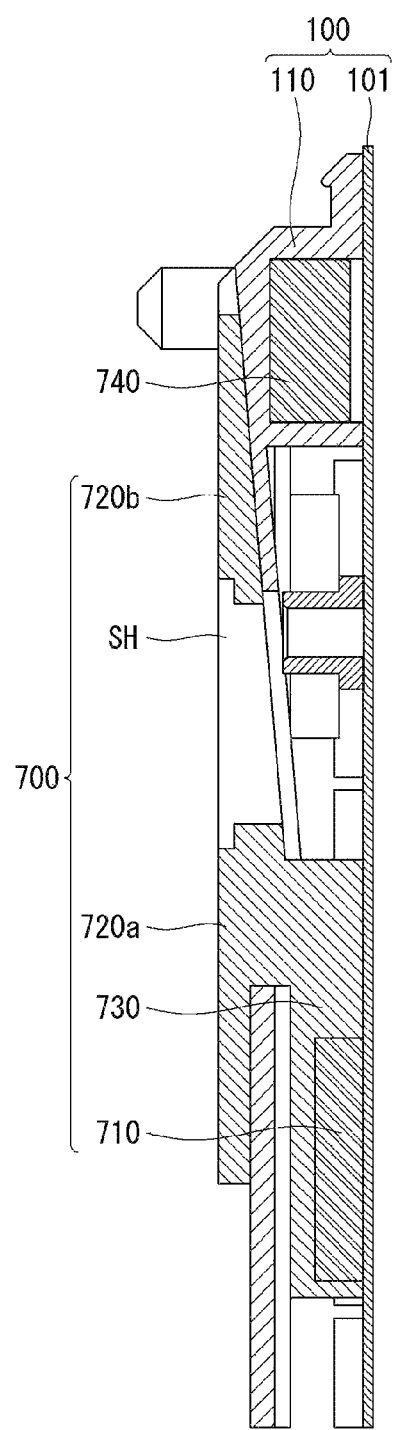

Referring to FIGS. 23 to 25, a multi-display device 1000 (see FIG. 1) may include a display module 100, a frame 200, a displacement adjustment unit 700, a fastening part 750, and a mounting part 740.

The display module 100 may display images. The display module 100 may include a display panel 101, a module cover 110, and a driving circuit board 105.

The display panel 101 may include a plurality of pixels.

The module cover 110 may be disposed behind the display panel 101. The module cover 110 may include a predetermined inner space. The module cover 110 may include a guide groove 111. The guide groove 111 is disposed on a back surface of the module cover 110, and may be formed to be long in an up-down direction. The guide groove 111 may be positioned to be adjacent to a corner of the module cover 110. The guide groove 111 may include an inclined inner surface.

The driving circuit board 105 may be disposed on a back side or back surface of the display panel 101. The driving circuit board 105 may be disposed in the inner space of the module cover 110. The driving circuit board 105 may be electrically connected to the display panel 101.

The frame 200 may be disposed behind the display module 100. The frame 200 may include a plurality of mounting holes 205. At least one mounting hole 205 may be disposed in each corner of the frame 200. The mounting hole 205 may be concave toward a back surface of the frame 200 from a front surface of the frame 200.

The fastening part 750 may be inserted into the mounting hole 205 and fastened. The fastening part 750 may include a fastening head part 750a and a fastening body part 750b.

The fastening head part 750a may have a predetermined diameter and a predetermined thickness. The fastening head part 750a may have a cylindrical shape.

The fastening body part 750b may be disposed on a lower part or a lower surface of the fastening head part 750a. The fastening body part 750b may be extended from the lower part of the fastening head part 750a. The fastening body part 750b may have a diameter smaller than the diameter of the fastening head part 750a.

The fastening part 750 may include a metallic material.

The mounting part 740 may be disposed in the inner space of the module cover 110. The mounting part 740 may be disposed at a position corresponding to the fastening part 750 disposed at the corner of the frame 200. The mounting part 740 may be spaced apart from the fastening part 750 in a thickness direction or a back-and-forth direction. The mounting part 740 may include a magnetic material. The mounting part 740 may be referred to as a magnetic body 740 in the following and following embodiments.

The mounting part 740 and the fastening part 750 are disposed to be spaced apart from each other, but they can be fastened by magnetism generated therebetween. Accordingly, the display module 110 can be stably supported on the frame 200.

The displacement adjustment unit 700 may be disposed between the module cover 110 and the frame 200. The displacement adjustment unit 700 may be disposed to be adjacent to the corner of the module cover 110. The displacement adjustment unit 700 is inserted into the guide groove 111 formed on the back surface of the module cover 110 and may slide in the up-down direction.

The displacement adjustment unit 700 may include a moving part 710, a housing part 730, and a sliding part 720.

The moving part 710 may face or be in contact with the back surface of the display panel 101. The moving part 710 may be disposed inside the guide groove 111. The moving part 710 may have a predetermined area and thickness. For example, the moving part 710 may have a rectangular parallelepiped shape. The moving part 710 may include a magnetic material.

The housing part 730 may be disposed behind the moving part 710. The housing part 730 may surround all surfaces except a surface of the moving part 710 facing the module cover 110. In other words, the moving part 710 may be inserted into an inner space of the housing part 730.

The sliding part 720 may include a sliding body 720a which is fastened or coupled to the housing part 730 and an extension part 720b which is extended from an upper side or one side of the sliding body 720a. The extension part 720b may include an upper surface which can cover the guide groove 111 and a lower surface which faces the module cover. The upper surface may be formed to be flat so as to cover the guide groove 111 as a whole. The lower surface may be formed to be inclined at a predetermined angle. An inner surface of the guide groove 111 may be inclined so as to correspond to the lower surface of the inclined extension part 720b. A thickness of the extension part 720b may become thinner as a distance from the sliding body 720a increases. The lower surface of the extension part 720b may be an inclined surface that becomes thinner as the distance from the sliding body 720a increases. The extension part 720b may include an inclined hole SH. The inclined hole SH may penetrate the extension part 720b. The inclined hole SH penetrating the extension part 720b may be formed to be long in the up-down direction.

Figure 26:
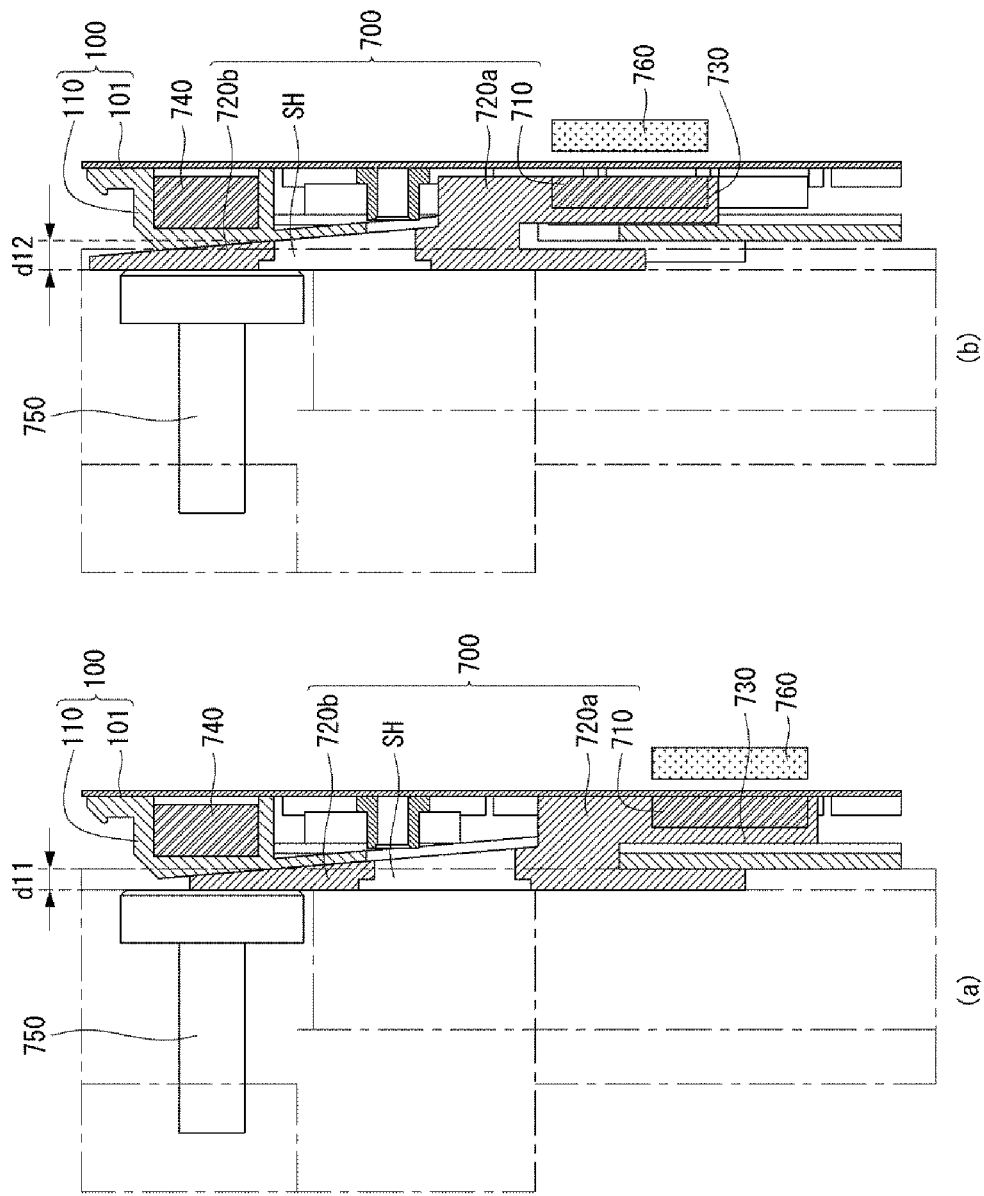

Referring to FIG. 26, an adjustment part 760 may be disposed on a front surface of the display module 100. The adjustment part 760 may be in contact with or face the display module 100.

As shown in FIG. 26 (a), the adjustment part 760 facing the front surface of the display module 100 may be disposed to correspond to the moving part 710 of the displacement adjustment unit 700.

At this time, a distance between the back surface of the display module 100 and the frame 200 may be spaced apart by an eleventh length d11. The eleventh length d11 may be referred to as an eleventh distance d11.

One side of the extension part 720b may be positioned between the mounting part 740 and the fastening part 750. The extension part 720b may be referred to as a slide part 720b. The upper surface of the extension part 720b may be disposed inside the guide groove 111 (see FIG. 24), or may be disposed at substantially the same position as the back surface of the module cover 110.

As shown in FIG. 26 (b), the adjustment part 760 may be moved up and down in the display module 100. The adjustment part 760 may be moved toward an upper side of the display module 100.

Under control of the adjustment part 760, the moving part 710 may be moved or adjusted toward the upper side of the display module 100.

At this time, a distance between the back surface of the display module 100 and the frame 200 may be spaced apart by a twelfth length d12. The twelfth length d12 may be referred to as a twelfth distance d12. The twelfth length d12 may be longer than the eleventh length d11.

One side of the extension part 720b may be positioned between the display module 100 and the frame 200. One side of the inclined hole SH may be positioned between the mounting part 740 and the fastening part 750.

At this time, the upper surface of the extension part 720b may be disposed outside the guide groove 111 (see FIG. 24) or at a higher position than the back surface of the module cover 110. The lower surface of the extension part 720b may slide along the inner surface of the inclined guide groove 111 (see FIG. 24).

As described above, when the adjustment part 760 moves upward or in an upward direction in the up-down direction, the displacement adjustment unit 700 can be moved upward or in the upward direction corresponding to the adjustment part 760. Accordingly, the distance between the display module 100 and the frame 200 can be gradually longer. Then, the displacement adjustment unit 700 can be protruded from the module cover 110 and positioned thereon.

Conversely, when the adjustment part 760 moves downward or in a downward direction in the up-down direction, the displacement adjustment unit 700 can be moved downward or in the downward direction under control of the adjustment part 760. Accordingly, the distance between the display module 100 and the frame 200 can be gradually shortened. Then, the displacement adjustment unit 700 can be inserted into the module cover 110 and positioned thereon.

Figure 27:
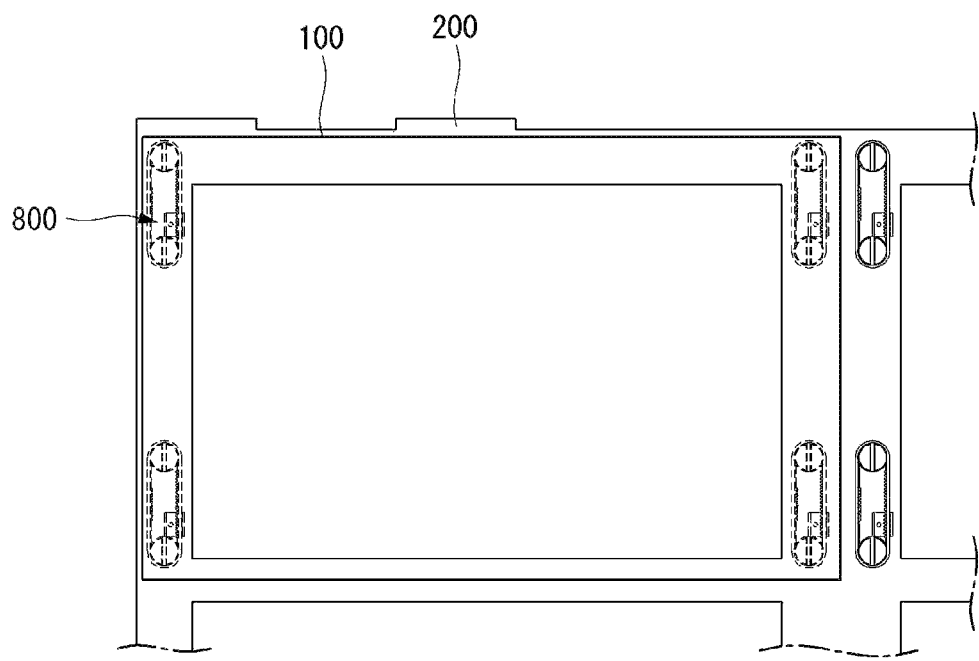
FIGS. 27 to 34 are views showing a multi-display device according to a sixth embodiment of the present disclosure.
Figure 28:
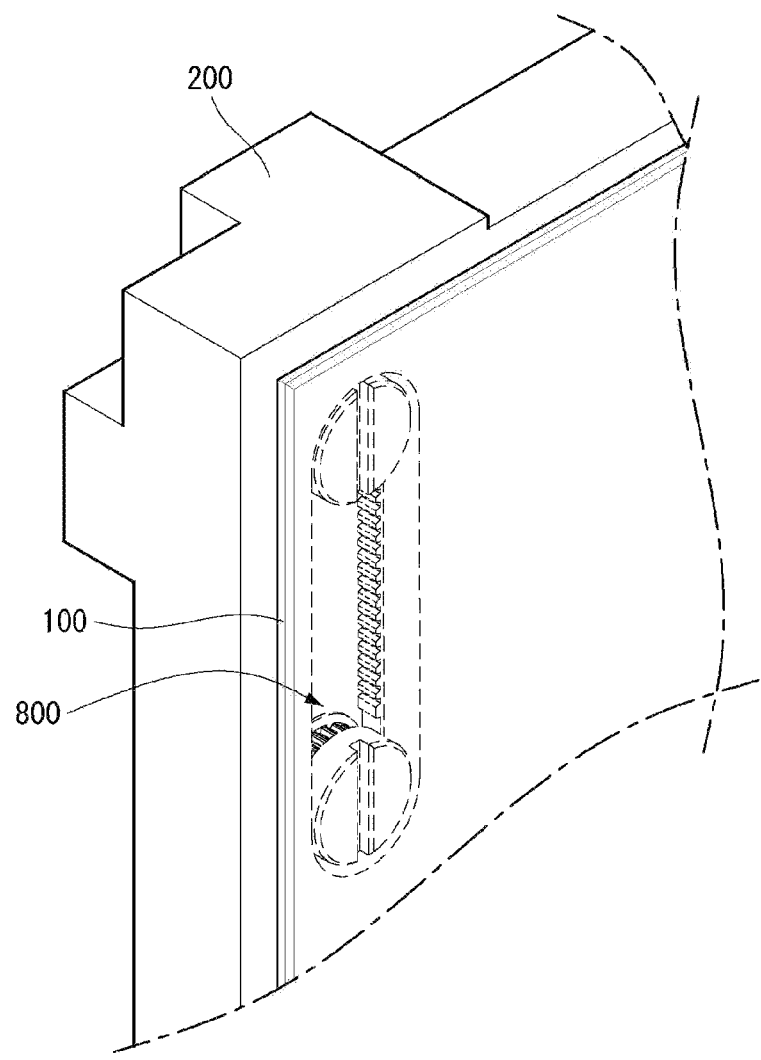
Figure 29:
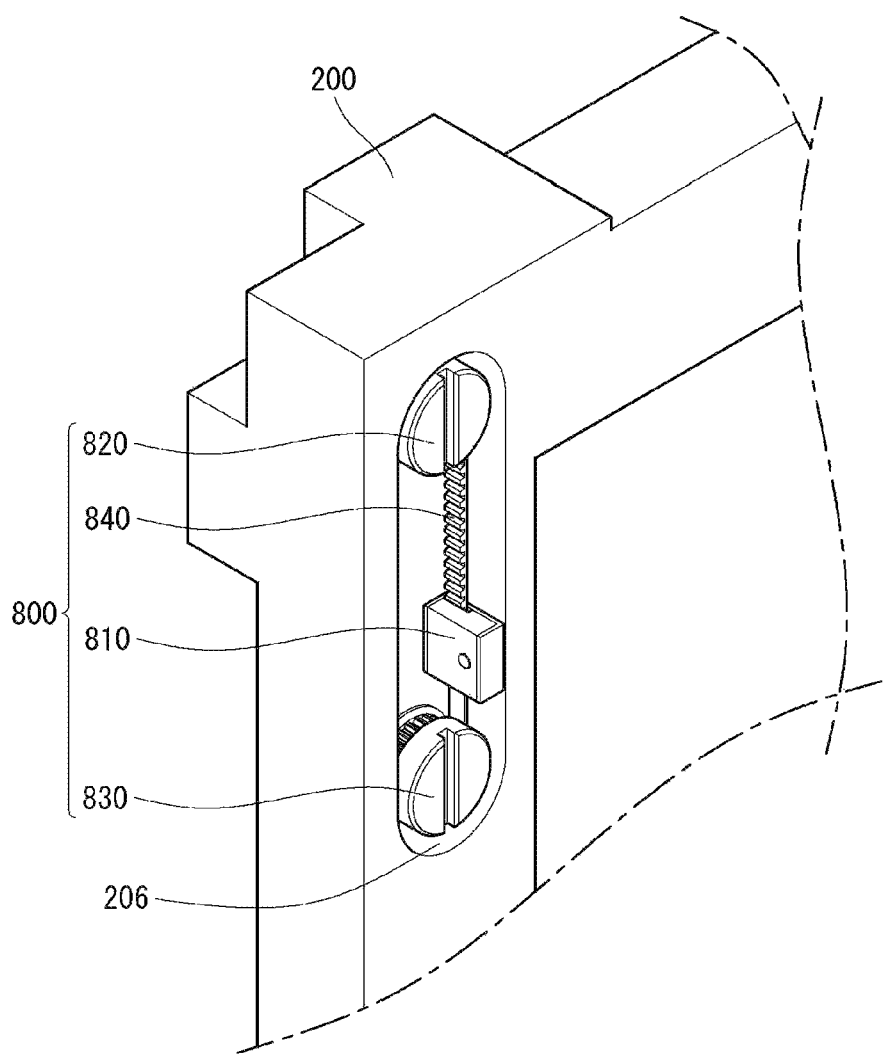

Referring to FIGS. 27 to 29, a multi-display device 1000 (see FIG. 1) may include a display module 100, a frame 200, and a displacement adjustment unit 800.

The display module 100 may display images.

The frame 200 may be disposed behind the display module 100. The frame 200 may include a plurality of mounting holes 206. The mounting holes 206 may be disposed at each corner of the frame 200. The mounting hole 206 may be formed concavely from a front surface of the frame 200 toward a back surface of the frame 200. The mounting hole 206 may be formed to be long in an up-down direction.

The displacement adjustment unit 800 may be inserted into the mounting hole 206, which is formed to be long in the up-down direction, and may be fastened. The displacement adjustment unit 800 may include a first fastening part 820, a second fastening part 830, a belt part 840, and a moving part 810.

The first fastening part 820 may be disposed on an upper side of an inside of the mounting hole 206. An upper surface of the first fastening part 820 may face or be in contact with a back surface of the display module 100.

The second fastening part 830 may be spaced apart from the first fastening part 820 in the up-down direction. The second fastening part 830 may be disposed on a lower side of the inside of the mounting hole 206. An upper surface of the second fastening part 830 may face or be in contact with the back surface of the display module 100.

The belt part 840 may be disposed inside the mounting hole 206, and surround an outer peripheral surface or a circumferential surface of the first fastening part 820 and an outer peripheral surface or a circumferential surface of the second fastening part 830. The belt part 840 may have a plurality of mountains and valleys disposed inside or on an inner side thereof.

The moving part 810 may be disposed between the first fastening part 820 and the second fastening part 830. The moving part 810 may be mounted on the belt part 840. The moving part 810 may include a metallic material.

Figure 30:
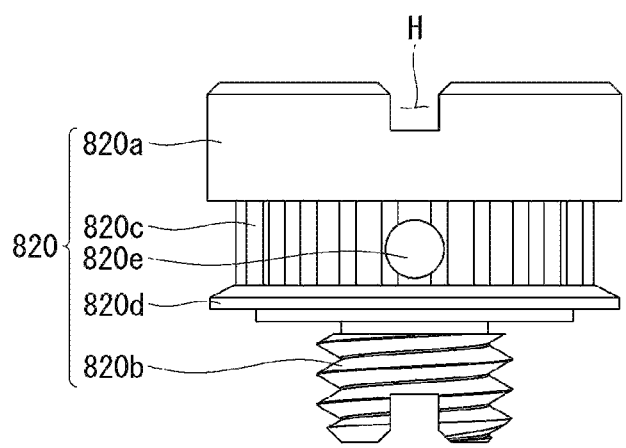

Referring to FIG. 30, the first fastening part 820 may include a first fastening head part 820a, a first fastening body part 820b, a first belt mounting part 820c, and a first separation preventing part 820d.

The first fastening head part 820a may have a predetermined diameter and thickness. The first fastening part 820 may include a fastening groove H which crosses the upper surface of the first fastening part 820.

The first fastening body part 820b may be disposed on a lower surface or a lower side surface of the first fastening head part 820a. The first fastening body part 820b may have a diameter smaller than the diameter of the first fastening head part 820a. The first fastening body part 820b may include a screw thread. The screw thread having a constant pitch may be formed on an outer peripheral surface of the first fastening body part 820b.

The first belt mounting part 820c may be disposed between the first fastening head part 820a and the first fastening body part 820b. The first belt mounting part 820c may include a plurality of mountains and valleys formed to be long in the up-down direction. The first belt mounting part 820c may have a width substantially equal to a width of the belt part 840. The first belt mounting part 820c may include a fixing hole 820e.

The first separation preventing part 820d may be disposed between the first belt mounting part 820c and the first fastening body part 820b. The first separation preventing part 820d may have a diameter larger than a diameter of the first belt mounting part 820c. The first separation preventing part 820d can prevent the belt part 840 mounted on the first belt mounting part 820c from being separated.

Figure 31:
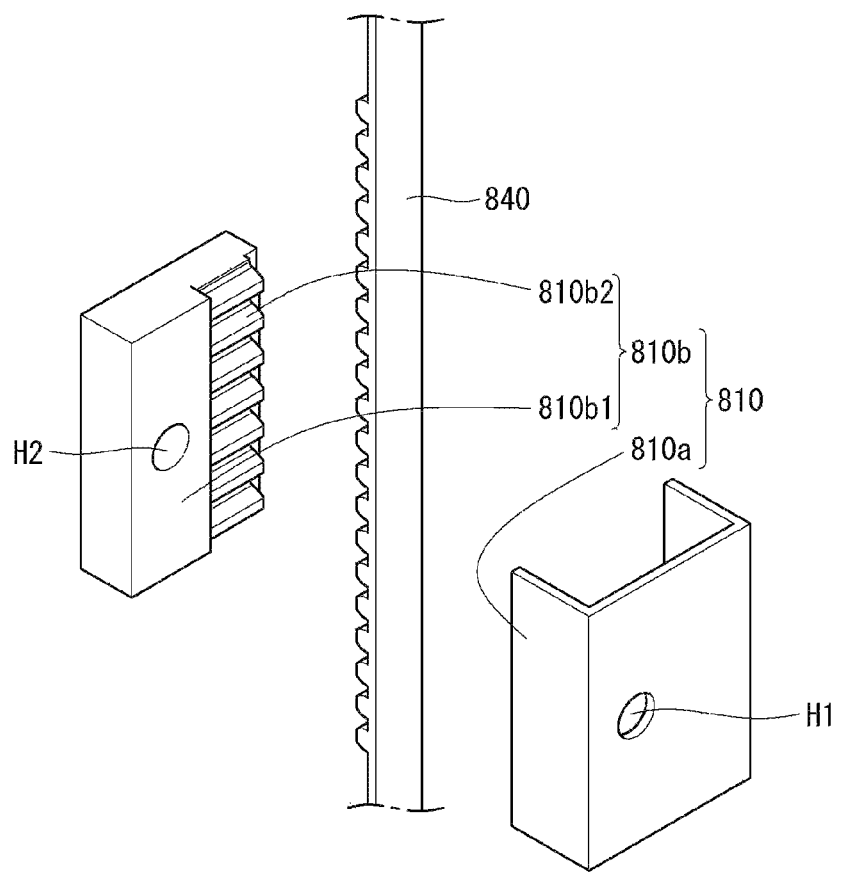

Referring to FIG. 31, the moving part 810 may include a moving body part 810b and a moving cover part 810a.

The moving body part 810b may be formed to be long in the up-down direction. For example, the moving part 810 may have a rectangular parallelepiped shape. The moving part 810 may include a metallic material.

The moving body part 810b may include a coupling region 810b1 and a belt mounting region 810b2.

The coupling region 810b1 may be formed on one side of the moving part 810. The coupling region 810b1 may face or be in contact with an inner surface of the moving cover part 810a. The coupling region 810b1 may include a coupling hole H2.

The belt mounting region 810b2 may be formed on other side of the moving part 810. The belt mounting region 810b2 may include a plurality of mountains and valleys. The mountains and the valleys of the belt mounting region 810b2 can be coupled or fastened by engaging with the mountains and valleys of the belt part 840.

The moving cover part 810a may be formed to surround the moving body part 810b. The moving cover part 810a may also surround the belt part 840 coupled to the coupling region 810b1 of the moving body part 810b. The belt part 840 may be disposed between the belt mounting region 810b2 and the moving cover part 810a.

The moving cover part 810a may include a cover hole H1. The cover hole H1 may be formed at a position corresponding to the coupling hole H2 of the moving body part 810b.

Although not shown, a fastening member may be inserted into the coupling hole H2 through the cover hole H1. Accordingly, the belt part 840 can be firmly mounted on the moving part 810.

Figure 32:
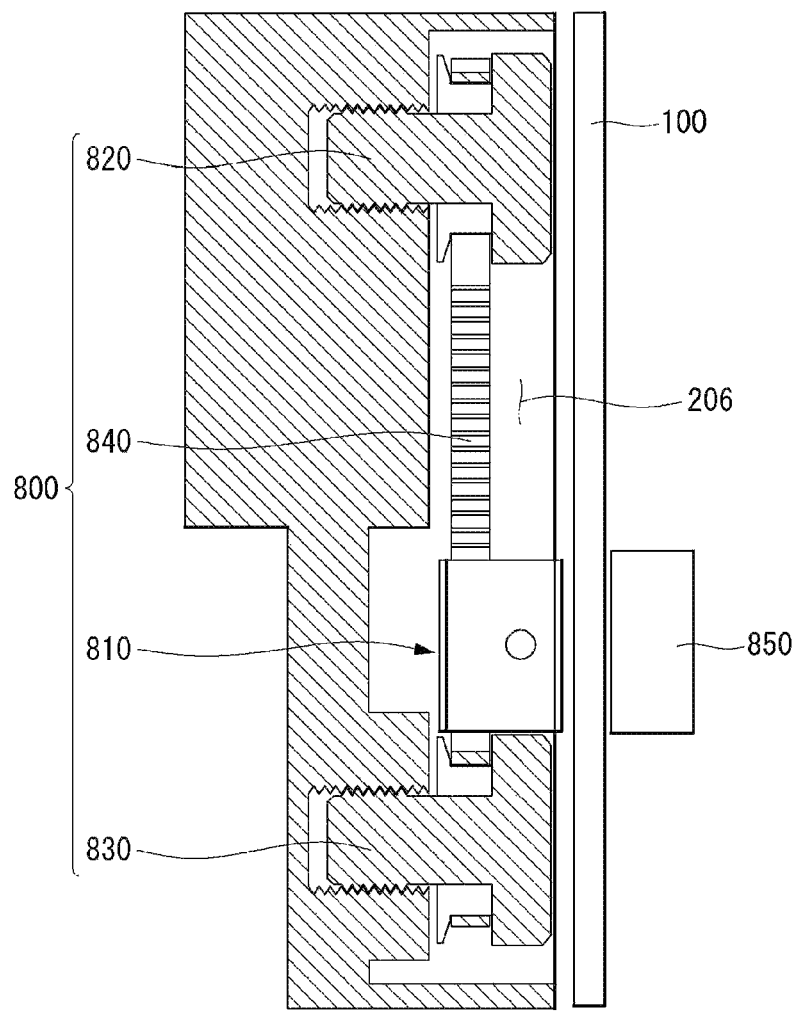
Figure 33:
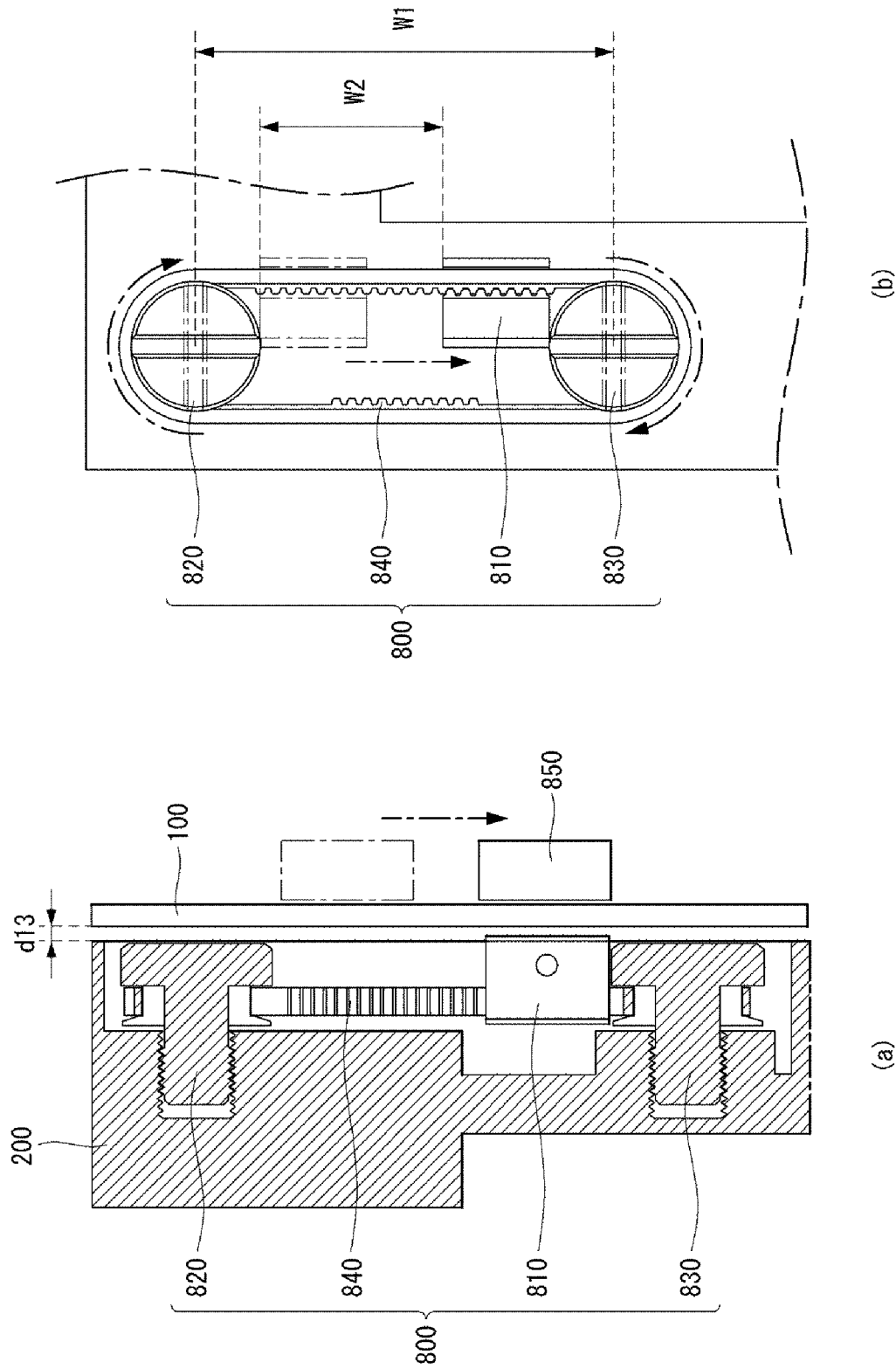
Figure 34:
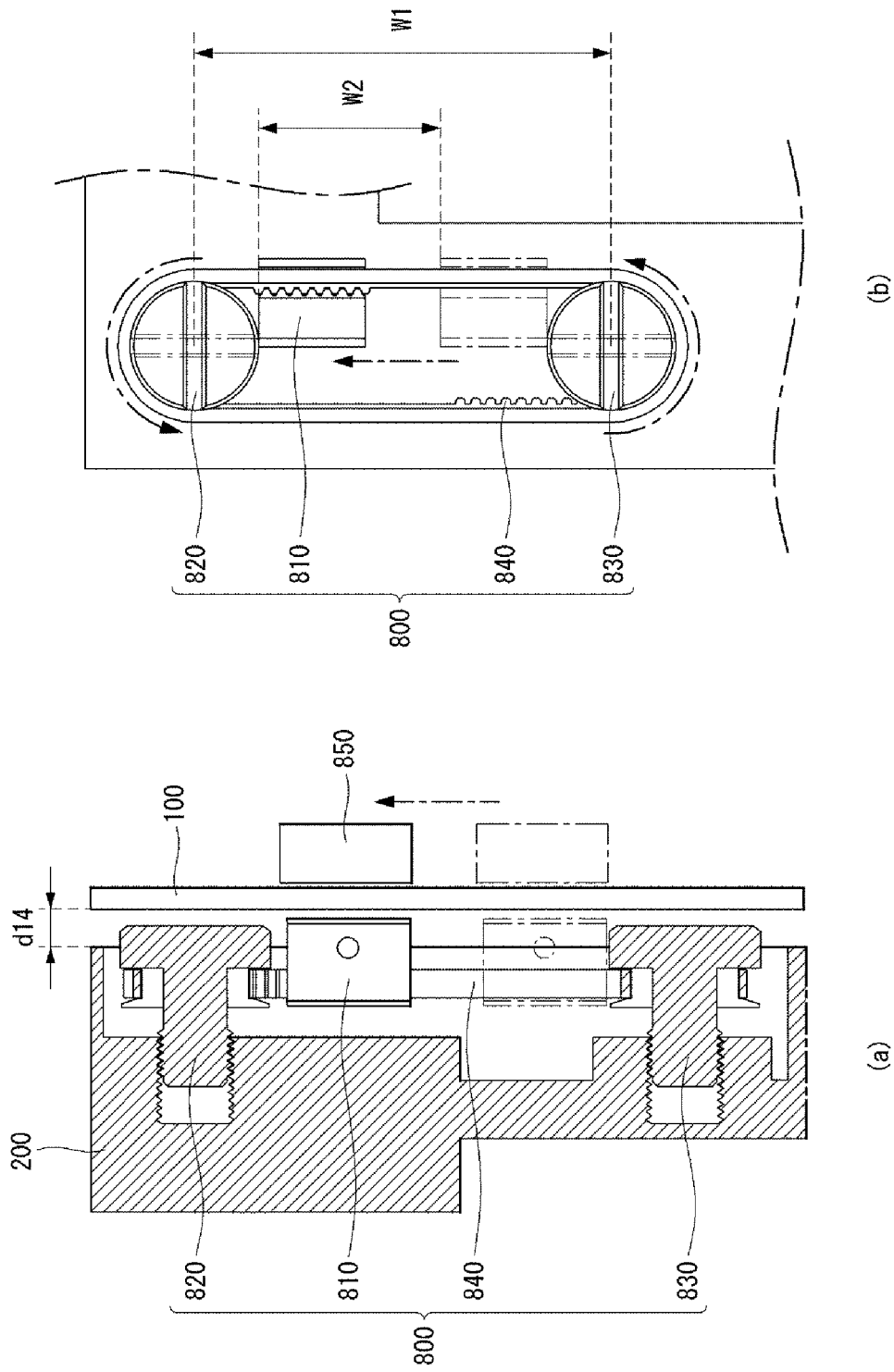

Referring to FIGS. 32 to 34, an adjustment part 850 may be disposed on a front surface of the display module 100. The adjustment part 850 may be in contact with or face the display module 100. The adjustment part 850 may be disposed so as to correspond to the displacement adjustment unit 800. The adjustment part 850 may be positioned to overlap with the moving part 810 in a thickness direction.

A cross-sectional area of the adjustment part 850 may be substantially equal to or larger than a cross-sectional area of the displacement adjustment unit 800. The displacement adjustment unit 800 may reciprocate in the up-down direction under control of the adjustment part 850.

The adjustment part 850 may include a magnetic material.

As shown in FIG. 33 (a), the adjustment part 850 may face the display module 100 and may be moved up and down. The adjustment part 850 may be moved from the first fastening part 820 to the second fastening part 830. The adjustment part 850 may be disposed to be adjacent to the second fastening part 830.

The moving part 810 may be moved from the first fastening part 820 to the second fastening part 830 under control of the adjustment part 850.

As shown in FIG. 33 (b), when the moving part 810 moves from the first fastening part 820 to the second fastening part 830, the belt part 840 mounted on the moving part 810 can be driven. When the belt part 840 is driven, the first fastening part 820 and the second fastening part 830 mounted on the belt part 840 can be rotated in a first direction. The first direction may be referred to as a clockwise direction.

At this time, a distance between the display module 100 and the frame 200 may be spaced apart by a thirteenth length h13. The thirteenth length h13 may be referred to as a thirteenth distance h13.

As shown in FIG. 34 (a), the adjustment part 850 may face the display module 100 and may be moved up and down. The adjustment part 850 may be moved from the second fastening part 830 to the first fastening part 820. The adjustment part 850 may be disposed to be adjacent to the first fastening part 820.

The moving part 810 may be moved from the second fastening part 830 to the first fastening part 820 under control of the adjustment part 850.

As shown in FIG. 34 (b), when the moving part 810 is moved from the second fastening part 830 to the first fastening part 820, the belt part 840 mounted on the moving part 810 can be driven. When the belt 840 is driven, the first fastening part 820 and the second fastening part 830 mounted on the belt part 840 can be rotated in a second direction. The second direction may be opposite the first direction. The second direction may be referred to as a counterclockwise direction.

At this time, a distance between the display module 100 and the frame 200 may be spaced apart by a fourteenth length h14. The fourteenth length h14 may be referred to as a fourteenth distance h14. The fourteenth length h14 may be longer than the thirteenth length h13.

As described above, the moving part 810 may reciprocate in the up-down direction at a range W1 between a central axis of the first fastening part 820 and a central axis of the second fastening part 830. A maximum range W2 in which the moving part 810 can reciprocate may be a distance between the first fastening part 820 and an upper side of the moving part 810.

The distance between the display module 100 and the frame 200 can be adjusted within the maximum range W2 of the moving part 810.

The foregoing embodiments are merely examples and are not to be considered as limiting the present disclosure. The present teachings can be readily applied to other types of methods and apparatuses. The features, structures, methods, and other characteristics of the embodiments described herein may be combined in various ways to obtain additional and/or alternative embodiments.

Certain embodiments or other embodiments of the invention described above are not mutually exclusive or distinct from each other. Any or all elements of the embodiments of the invention described above may be combined or combined with each other in configuration or function.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A multi-display device, comprising:
a display module;
a frame positioned behind the display module;
a displacement adjustment unit positioned between the display module and the frame, mounted on the display module or the frame, and configured to adjust a distance between the display module and the frame; and
an attachment part fixed to the displacement adjustment unit and attached to or detached from the frame or the display module,
wherein the display module includes:
a first display module; and,
a second display module adjacent to the first display module,
wherein the displacement adjustment unit includes:
a first displacement adjustment unit installed at one of the first display module or the frame,
a second displacement adjustment unit installed at one of the second display module or the frame,
wherein the frame includes a mounting hole disposed at the other of the first display module or the frame,
wherein each of the first and second displacement adjustment unit is inserted into the mounting hole to adjust a difference of a height of the first display module and the second display module,
wherein the first displacement adjustment unit adjusts a first distance between the first display module and the frame, and
wherein the second displacement adjustment unit adjusts a second distance between the second display module and the frame,
wherein the attachment part includes:
a plurality of first magnetic parts; and,
a plurality of second magnetic parts having a polarity different from a polarity of the first magnetic part,
wherein the plurality of first and second magnetic parts are alternately arranged.

2. The multi-display device of claim 1, wherein the first and second displacement adjustment units rotate in a first direction or a second direction opposite the first direction,
when the first displacement adjustment unit rotates in the first direction, the first distance is gradually longer,
when the first displacement adjustment unit rotates in the second direction, the first distance is gradually shortened,
when the second displacement adjustment unit rotates in the first direction, the second distance is gradually longer, and
when the second displacement adjustment unit rotates in the second direction, the second distance is gradually shortened.

3. The multi-display device of claim 1, wherein the display module includes:
a display panel;
a module cover disposed behind the display panel; and,
a mounting part disposed in an inner space of the module cover,
wherein the displacement adjustment unit is partly inserted into the mounting part and mounted to the mounting part.

4. The multi-display device of claim 1, wherein the displacement adjustment unit includes:
a head part;
a body extended from a lower surface of the head part; and,
an adjustment bar extended from one side of the head part,
wherein the plurality of first and second magnetic parts are alternately arranged on an upper surface of the adjustment bar.

5. The multi-display device of claim 4, wherein the adjustment bar rotates in a first direction with respect to a center of the head part or in a second direction opposite the first direction,
when the adjustment bar rotates in the first direction, the distance is gradually longer,
when the adjustment bar rotates in the second direction, the distance is gradually shorten.

* * * * *